(12) United States Patent
Lee et al.

(10) Patent No.: US 12,354,430 B2
(45) Date of Patent: Jul. 8, 2025

(54) STRUCTURAL COLORATION SUBSTRATE, METHOD FOR MANUFACTURING STRUCTURAL COLORATION SUBSTRATE, AND SECURITY VERIFICATION SYSTEM USING STRUCTURAL COLORATION SUBSTRATE MANUFACTURED THEREBY

(71) Applicant: KOREA INSTITUTE OF MACHINERY & MATERIALS, Daejeon (KR)

(72) Inventors: Taikmin Lee, Daejeon (KR); Inyoung Kim, Seoul (KR); Sin Kwon, Sejong (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 789 days.

(21) Appl. No.: 17/287,584

(22) PCT Filed: Oct. 2, 2019

(86) PCT No.: PCT/KR2019/012931
§ 371 (c)(1),
(2) Date: Apr. 22, 2021

(87) PCT Pub. No.: WO2020/091241
PCT Pub. Date: May 7, 2020

(65) Prior Publication Data
US 2021/0390813 A1 Dec. 16, 2021

(30) Foreign Application Priority Data

Oct. 31, 2018 (KR) .................. 10-2018-0131637
Oct. 31, 2018 (KR) .................. 10-2018-0131643

(51) Int. Cl.
*G07D 7/1205* (2016.01)
*C23C 16/455* (2006.01)
(Continued)

(52) U.S. Cl.
CPC ..... *G07D 7/1205* (2017.05); *C23C 16/45529* (2013.01); *C23C 28/04* (2013.01);
(Continued)

(58) Field of Classification Search
CPC . C23C 16/45529; C23C 16/455; C23C 28/04; G02B 1/12; G02B 26/10;
(Continued)

(56) References Cited

U.S. PATENT DOCUMENTS 9,382,432 B1    7/2016  McDaniel
2002/0021003 A1  2/2002  McGrew
(Continued)

FOREIGN PATENT DOCUMENTS

CN       108699672 A     10/2018
DE   10 2015 212 492 A1   1/2017
(Continued)

OTHER PUBLICATIONS

Extended European Search Report issued on Jun. 2, 2022, for corresponding European Patent Application No. 19878263.3.
(Continued)

*Primary Examiner* — Justin V Lewis
(74) *Attorney, Agent, or Firm* — Hauptman Ham, LLP

(57) ABSTRACT

In a structural coloration substrate, a method for manufacturing the structural coloration substrate, and a security verification system using the structural coloration substrate manufactured by the method, the method includes forming a first pattern displaying a first color on a base substrate, using a quantum dot, and stacking at least one structural coloration layer on the base substrate on which the first
(Continued)

pattern is formed. The first color of the first pattern is changed and displayed, as the at least one structural coloration layer is stacked.

19 Claims, 30 Drawing Sheets

(51) Int. Cl.
| | | |
|---|---|---|
| *C23C 28/04* | (2006.01) | |
| *G02B 1/12* | (2006.01) | |
| *G02B 26/10* | (2006.01) | |
| *G02B 27/09* | (2006.01) | |
| *G07D 7/00* | (2016.01) | |
| *G07D 7/128* | (2016.01) | |

(52) U.S. Cl.
CPC .............. *G02B 1/12* (2013.01); *G07D 7/003* (2017.05); *G07D 7/128* (2013.01); *G02B 26/10* (2013.01); *G02B 27/0977* (2013.01)

(58) Field of Classification Search
CPC .... G02B 27/0977; G02B 27/09; G07D 7/003; G07D 7/00; G07D 7/128
USPC .................. 283/67, 72, 87, 91, 94, 98, 901
See application file for complete search history.

(56) References Cited

U.S. PATENT DOCUMENTS

| | | |
|---|---|---|
| 2008/0251581 A1 | 10/2008 | Faenza |
| 2012/0168506 A1 | 7/2012 | Ruehrmair et al. |
| 2015/0048348 A1* | 2/2015 | Huang .............. G02F 1/133512 257/40 |
| 2016/0116801 A1* | 4/2016 | Fan .................. G02F 1/133617 349/71 |
| 2018/0017726 A1 | 1/2018 | Kim et al. |
| 2018/0138027 A1* | 5/2018 | Oku .................. G02F 1/133617 |

FOREIGN PATENT DOCUMENTS

| | | |
|---|---|---|
| EP | 2 466 994 A2 | 6/2012 |
| EP | 2 698 404 A1 | 2/2014 |
| JP | 2004-177636 A | 6/2004 |
| JP | 2012-022455 A | 2/2012 |
| JP | 2013-029805 A | 2/2013 |
| JP | 2015-058600 A | 3/2015 |
| JP | 2017-054290 A | 3/2017 |
| KR | 10-2014-0030404 A | 3/2014 |
| KR | 10-2015-0031862 A | 3/2015 |
| KR | 10-1527360 B1 | 6/2015 |
| KR | 10-1703914 B1 | 2/2017 |
| WO | 2010/082625 A1 | 7/2010 |
| WO | 2014/206476 A1 | 12/2014 |

OTHER PUBLICATIONS

International Search Report issued Jan. 14, 2020, corresponding to International Application No. PCT/KR2019/012931.

* cited by examiner

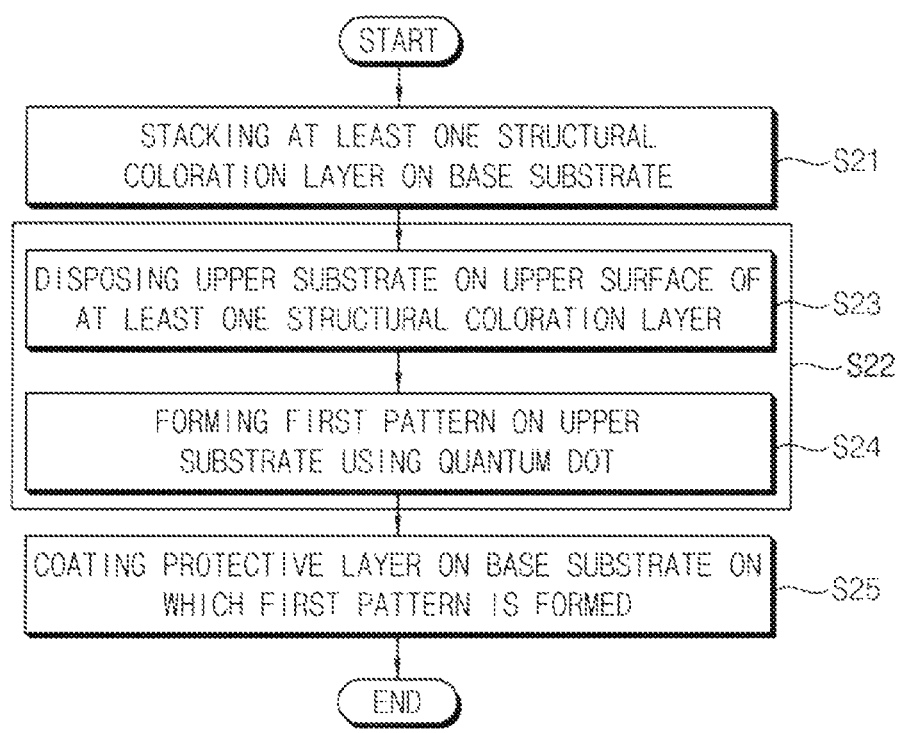

STRUCTURAL COLORATION SUBSTRATE, METHOD FOR MANUFACTURING STRUCTURAL COLORATION SUBSTRATE, AND SECURITY VERIFICATION SYSTEM USING STRUCTURAL COLORATION SUBSTRATE MANUFACTURED THEREBY

CROSS-REFERENCE TO RELATED APPLICATION

This present application is a national stage filing under 35 U.S.C § 371 of PCT application number PCT/KR2019/012931 filed on Oct. 2, 2019 which is based upon and claims the benefit of priority to Korean Patent Application No. 10-2018-0131637 filed Oct. 31, 2018 and 10-2018-0131643 filed Oct. 31, 2018 in the Korean Intellectual Property Office. The disclosures of the above-listed applications are hereby incorporated by reference herein in their entireties.

BACKGROUND

1. Field of Disclosure

The present disclosure of invention relates to a structural coloration substrate, a method for manufacturing the structural coloration substrate, and a security verification system using the structural coloration substrate manufactured by the method, and more specifically the present disclosure of inventions relates to a structural coloration substrate having structural coloration providing a reflective light having various kinds of colors with respect to an incident light, a method for manufacturing the structural coloration substrate, and a security verification system using the structural coloration substrate manufactured by the method. Here, the structural coloration substrate is a complex structural coloration substrate to be encrypted, and thus the security verification system may confirm whether moneys or expensive products are authentic or not.

2. Description of Related Technology

When a light is incident into a film, the light reflected from a surface of the film, and the light reflected from the film after passing through the film, are constructively interfered, and then the color of the light externally displayed is determined. Here, the change or the variation of the color of the light externally displayed according to an incident angle of the light is defined as structural coloration.

The color due to the structural coloration may be changed or varied according to the number of layers stacked on the film, the height of the layers stacked on the film, and so on. Thus, various kinds of products using the above-mentioned properties are manufactured.

Recently, as preference for the product having a relatively high-quality exterior is increases, the structural coloration may be applied to the exterior of a sunglass or an expensive product, or may be applied a display device.

Unlike to the above-mentioned structural coloration in which various kinds of colors are displayed according to viewing angles, an identification film in which specific patterns are formed to have a specific reflective spectrum on a specific wavelength has been developed and applied to an anti-counterfeiting product. For example, in Korean patent No. 10-1527360, a plurality of reflective spectrums covering various kinds of wavelengths is formed in the identification film, and thus the identification or the security on the identification film may be enhanced.

In addition, in Korean patent No. 10-1703914, a magneto-variable material displaying colors changed according to the change of the magnetic field, is used to manufacture the anti-counterfeiting product.

Accordingly, the structural coloration or the light conversion structure may be widely used, and thus a structure displaying the reflective light having various colors or patterns more efficiently is more needed.

Related prior arts are Korean patent No. 10-1527360 and Korean patent No. 10-1703914.

SUMMARY

The present invention is developed to solve the above-mentioned problems of the related arts. The present invention provides a structural coloration substrate having more various and more complex patterns to be encrypted, so that the security may be more increased and the manufacturing may be more simplified.

In addition, the present invention also provides a method for manufacturing the structural coloration substrate.

In addition, the present invention also provides a security verification system using the structural coloration substrate manufactured by the method.

According to an example embodiment, in the method for manufacturing a structural coloration substrate, the method includes forming a first pattern displaying a first color on a base substrate, using a quantum dot, and stacking at least one structural coloration layer on the base substrate on which the first pattern is formed. The first color of the first pattern is changed and displayed, as the at least one structural coloration layer is stacked.

In an example, the base substrate may absorb a light and externally display a second color different from the first color. The second color of the base substrate may be changed and displayed, as the at least one structural coloration layer is stacked.

In an example, in forming the first pattern, an upper substrate may be disposed on the base substrate. The first pattern may be formed on the upper substrate, using the quantum dot.

In an example, in forming the first pattern, the first pattern may be embedded inside of the upper substrate, or the first pattern may be protruded from an upper surface of the upper substrate.

In an example, the first pattern may be formed via one of, imprinting the quantum dot onto the upper substrate, filling the quantum dot in a groove formed on the upper substrate via capillary phenomenon, and inkjet printing the quantum dot on the upper substrate.

In an example, in stacking at least one structural coloration layer, each structural coloration layer may be stacked via an atomic layer deposition (ALD).

In an example, the upper substrate may be a transparent substrate.

According to another example embodiment, in a method for manufacturing a structural coloration substrate, the method includes stacking at least one structural coloration layer on a base substrate, and forming a first pattern displaying a first color on an upper surface of the at least one structural coloration layer, using a quantum dot. A color of the base substrate except for the first pattern displaying the first color is changed and displayed, as the at least one structural coloration layer is stacked.

According to still another example embodiment, in a method for manufacturing a structural coloration substrate, the method includes stacking at least one structural coloration layer on a base substrate, forming a first pattern displaying a first color on an upper surface of the at least one structural coloration layer, using a quantum dot, and additionally stacking at least one structural coloration layer on the base substrate on which the first pattern is formed. The first color of the first pattern is changed and displayed, as the at least one structural coloration layer is additionally stacked.

According to still another example embodiment, in a method for manufacturing a structural coloration substrate, the method includes stacking at least one structural coloration layer on a base substrate, patterning the at least one structural coloration layer, to form a first pattern, extending the first pattern, to form a first extending pattern on the base substrate, and filling a quantum dot displaying a first color inside of the first pattern and the first extending pattern. A color of the base substrate except for the first pattern and the first extending pattern displaying the first color is changed and displayed, as the at least one structural coloration layer is stacked.

In an example, the method may further include coating a protective layer on upper surfaces of the at least one structural coloration layer and the first pattern.

In an example, in forming the first pattern, a mask pattern may be formed on the upper surface of the at least one structural coloration layer, and the at least one structural coloration layer may be etched to form the first pattern.

In an example, in forming the first extending pattern, the base substrate may be etched using a mask pattern and the at least one structural coloration layer as a mask, to form the first extending pattern.

According to still another example embodiment, in a method for manufacturing a structural coloration substrate, the method includes forming a first pattern displaying a first color on a base substrate, using a quantum dot, stacking at least one structural coloration layer displaying a second color on the base substrate on which the first pattern is formed, and forming a light conversion structure on the at least one structural coloration layer.

In an example, the first color may be changed and displayed as the at least one structural coloration layer is stacked, and the second color may be changed and displayed as the light conversion structure is formed.

In an example, in forming the light conversion structure, the light conversion structure may be integrally formed on the at least one structural coloration layer, and the light conversion structure may have a base frame and at least one structure protruded or concaved from the base frame.

According to still another example embodiment, in a method for manufacturing a structural coloration substrate, the method includes stacking at least one structural coloration layer displaying a second color on a base substrate, forming a first pattern displaying a first color on an upper surface of the at least one structural coloration layer, using a quantum dot, and forming a light conversion structure on the base substrate on which the first pattern is formed. The light conversion structure changes the second color and displays the changed color.

According to still another example embodiment, in a method for manufacturing a structural coloration substrate, the method includes stacking at least one structural coloration layer displaying a second color on a base substrate, forming a first pattern displaying a first color on an upper surface of the at least one structural coloration layer, using a quantum dot, additionally stacking at least on structural coloration layer displaying a color different from the second color on the base substrate on which the first pattern is formed, and forming a light conversion structure on the upper surface of the at least one structural coloration layer.

According to still another example embodiment, in a method for manufacturing a structural coloration substrate, the method includes forming a first pattern displaying a first color on a base substrate, using a quantum dot, forming a light conversion structure on the base substrate on which the first pattern is formed, and stacking at least one structural coloration layer displaying a second color on an upper surface of the light conversion structure.

In an example, the first color may be changed and displayed as the at least one structural coloration layer is stacked, and the second color may be changed and displayed due to the light conversion structure.

According to still another example embodiment, a structural coloration substrate includes a base substrate, a first pattern disposed on the base substrate and having a quantum dot displaying a first color, at least one structural coloration layer disposed over the base substrate, and a light conversion structure disposed over at least one of the first pattern and the at least one structural coloration layer. Here, at least one structure having shapes different from each other is arranged on the light conversion structure.

In an example, the light conversion structure may further include a base frame disposed on at least one of an upper surface of the first pattern and an upper surface of the at least one structural coloration layer.

In an example, the at least one structure may have a shape upwardly protruded from the base frame.

In an example, the at least one structure may have a shape inwardly concaved from the base frame.

In an example, the at least one structure may extend over the base frame along a direction or be arranged in a predetermined pattern over the base frame, and a cross-sectional shape of each structure may be a triangle.

In an example, the at least one structural color layer may display a second color, and the second color may be changed and displayed as the at least one structure overlaps with the at least one structural coloration layer.

In an example, the second color may be changed and displayed with a different color, as the at least one structural coloration layer overlaps with the at least one structure having shapes different from each other.

In an example, the first pattern may be one of a dot pattern, a longitudinal pattern extending along a direction, and a checkerboard pattern crossing with each other.

In an example, the first pattern may be formed on an upper surface of the base substrate, the at least one structural coloration layer may be formed on the first pattern, and the light conversion structure may be disposed on an upper surface of the structural coloration layer.

In an example, the at least one structural coloration layer may be formed on an upper surface of the base substrate, the first pattern may be disposed on an upper surface of the at least one structural coloration layer, and the light conversion structure may be disposed on the first pattern.

In an example, the first pattern may be disposed on an upper surface of the base substrate, the light conversion structure may be disposed on the first pattern, and the at least one structural coloration layer may be formed on an upper surface of the light conversion structure.

According to still another example embodiment, a security verification system includes a security substrate, a database, a scanner, an information acquisition part and a deciding part. The security substrate includes at least two of a quantum dot, a structural coloration layer and a light conversion structure, and displays a security pattern externally. The security pattern is encrypted and stored in the database. The scanner is configured to scan the security substrate over the security substrate. The information acquisition part acquires the security pattern based on the scanned information. The deciding part decides whether the security pattern acquired by the information acquisition part is coincided with the security pattern encrypted and stored in the database.

In an example, the security substrate may be divided into a plurality of scanning areas based on the security pattern stored in the database, and the scanner may scan each divided area of the security substrate to identify a color at a central portion of each divided area of the security substrate.

In an example, the database may have an information on the color displayed according to an angle of an incident light, regarding the security pattern. The scanner may rotate with respect to the security substrate, to control the angle of the incident light incident into the security substrate.

In an example, the information acquisition part may be implemented as an application (APP) for a mobile device.

According to the present example embodiments, in addition to merely stacking the structural coloration layers, the structural coloration substrate may be formed using the quantum dot. Here, the structural coloration substrate has a various and complex pattern according to the pattern of the quantum dot, and thus the light having various kinds of colors may exit according to the direction of the incident light in the structural coloration substrate.

In addition, the structural coloration substrate may be formed using the quantum dot and the light conversion structure having at least one structure. Here, a various and complex pattern may be formed according to the pattern of the quantum dot and the shape or the arrangement of the structures of the light conversion structure, and thus the light having various kinds of colors may exit according to the direction of the incident light in the structural coloration substrate.

The above mentioned structural coloration substrate exiting various kinds of colors and patterns may be used as the security substrate. Thus, the encrypted security substrate may be manufactured, and the security substrate may be used to an encrypted code for moneys or expensive products for enhancing the security.

Here, the light conversion structure may be formed to be protruded from or be inwardly concaved from the base frame, and may include patterns extending along a direction or being arranged with various shapes. Thus, the security pattern may be diversified. In addition, as for the light conversion structure, a vertical cross-sectional shape may be a triangle, and combination of inner angles thereof may be diversified. Thus, the color externally displayed may be diversified to enhance encryption of the security pattern more effectively.

In addition, the quantum dot used pattern may be embedded in the substrate or be protruded from the substrate, and may be formed as the encrypted code such as the dot pattern, the longitudinal pattern and the checkerboard pattern. Here, the forming or the manufacturing the pattern may be performed more easily or more efficiently. The structural coloration layer may be stacked via an atomic layer deposition, and thus the coating may be performed to have a relatively fine thickness in a range about tens of nano meters and the effect of the structural coloration may be maintained. Thus, the structural coloration substrate may be effectively used for the moneys or the barcodes.

In addition, the protective layer is coated on an uppermost surface, and thus the encrypted security pattern may be prevented from being easily damaged. Thus, the security and the durability of the security pattern may be increased.

The structural coloration substrate having the quantum dot, the structural coloration layer and the light conversion structure may be easily manufactured, and thus various kinds of patterns may be included and the productivity and the manufacturing efficiency may be increased.

In addition, the security substrate manufactured by the method mentioned above, may be effectively used for the security verification system. Here, in the security verification system, the security pattern may be identified by the scanner, and the coincidence between the security pattern and the stored pattern may be decided.

Here, the structural coloration substrate may display various kinds of complex colors and patterns due to the addition of the quantum dot or the light conversion structure. Thus, if the structural coloration substrate is encrypted and used for the security verification system, the structural coloration substrate may be prevented from being imitated, and thus the security may be more increased. Here, the pattern or the color displayed by the structural coloration substrate may be imitated only if the entire processes for manufacturing the structural coloration substrate are substantially same, and it is impossible to find out the entire manufacturing processes from the final product of the structural coloration substrate. Thus, the imitation or the copy of the pattern or the color of the structural coloration substrate may be impossible in principle, and thus the security may be more increased.

However, due to the limitation of the manufacturing processes of the structural coloration substrate, the color or the pattern may be blurred or be hard to be identified in a boundary area between the adjacent patterns. Thus, in scanning the structural coloration substrate, the scanner would better scan the color or the pattern at a central portion of each pattern in the structural coloration substrate.

In addition, the database includes an information displayed by the security pattern according to the angle of the incident light, and the scanner may rotate to change the angle of the incident light incident into the security substrate. Thus, the verification for the single security substrate may be performed with various kinds of processes, and thus the security may be more increased.

BRIEF DESCRIPTION OF THE DRAWINGS

FIG. 3 is a flow chart illustrating a method for manufacturing a structural coloration substrate according to another example embodiment of the present invention;

DETAILED DESCRIPTION

Figure 1:
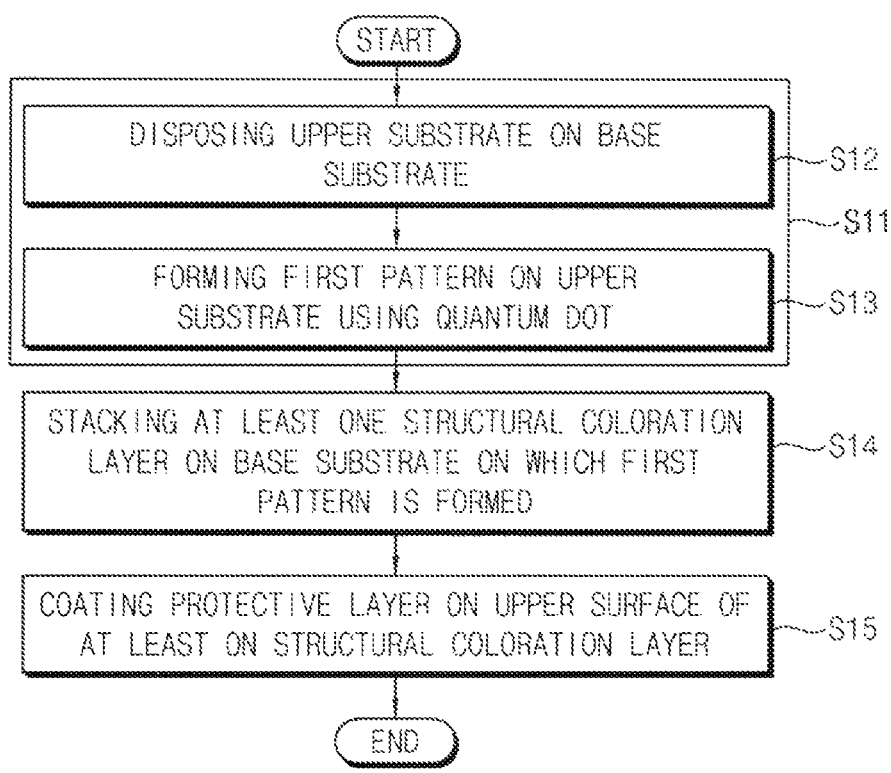
FIG. 1 is a flow chart illustrating a method for manufacturing a structural coloration substrate according to an example embodiment of the present invention.

The invention is described more fully hereinafter with Reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Spatially relative terms, such as "beneath," "below," "lower," "above," "upper" and the like, may be used herein for ease of description to describe one element or feature's relationship to another element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention is described more fully hereinafter with reference to the accompanying drawings, in which embodiments of the invention are shown.

Figure 2A:
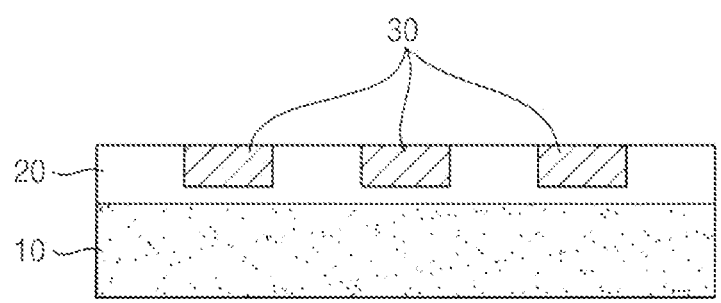
FIG. 2A, FIG. 2B and FIG. 2C are process views illustrating the method for manufacturing the structural coloration substrate of FIG. 1, and FIG. 2D and FIG. 2E are plan views illustrating a pattern and a color displayed externally through the structural coloration substrate of FIG. 2B.
Figure 2B:
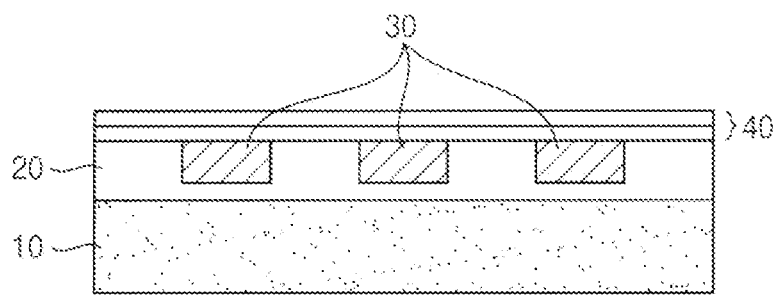
Figure 2C:
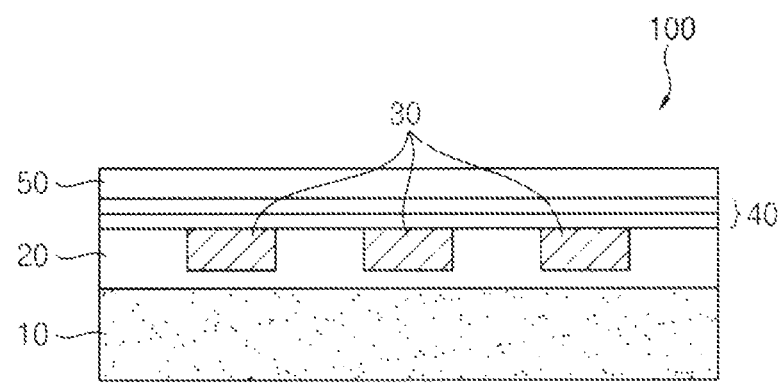
Figure 2D:
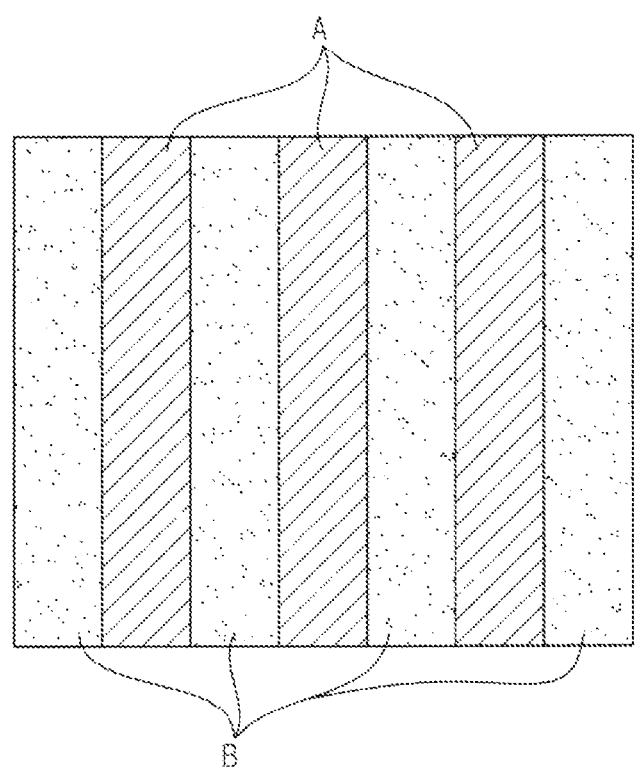
Figure 2E:
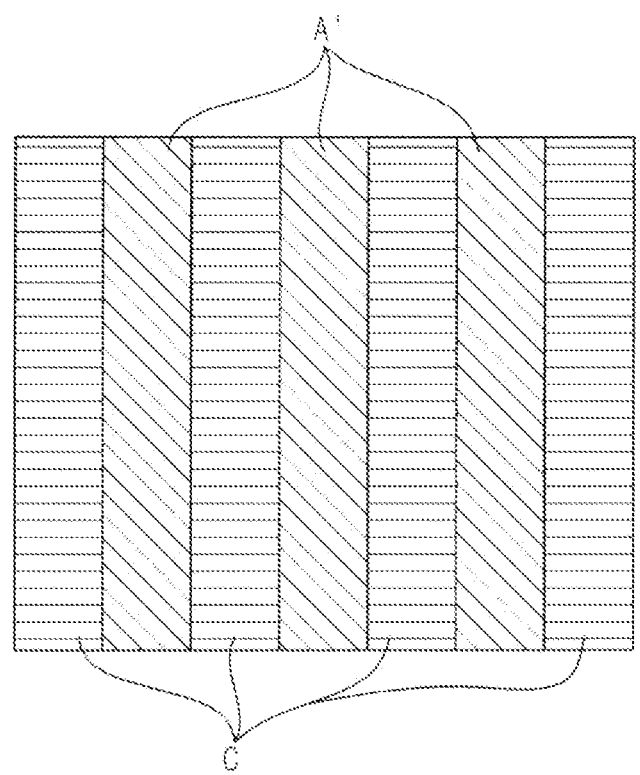

FIG. 1 is a flow chart illustrating a method for manufacturing a structural coloration substrate according to an example embodiment of the present invention. FIG. 2A, FIG. 2B and FIG. 2C are process views illustrating the method for manufacturing the structural coloration substrate of FIG. 1, and FIG. 2D and FIG. 2E are plan views illustrating a pattern and a color displayed externally through the structural coloration substrate of FIG. 2B.

Referring to FIG. 1, in manufacturing the structural coloration substrate 100 according to the present example embodiment, a first pattern 30 is formed on a base substrate 10 using a quantum dot (step S11), and the first pattern 30 displays a first color A. The base substrate 10 absorbs a light from outside, and here the light from outside means that the light passes through an upper substrate 20 and is provided to the base substrate 10. For example, the base substrate 10 may include a black or black-based color. When the base substrate 10 includes the black or black-based color, a second color B having the black or black-based color may be displayed as viewed in an upper portion of the base substrate 10, as illustrated in FIG. 2D.

The first pattern 30 formed by the quantum dot has a relatively thinner thickness, and thus the first pattern 30 is directly formed on the base substrate 10, and a structural coloration layer explained below may also be formed on the first pattern 30.

Alternatively, the first pattern 30 formed by the quantum dot may be formed on an upper substrate.

Thus, although the first pattern is explained to be formed on the upper substrate, the cases that the upper substrate is omitted and the first pattern is directly formed on the base substrate 10, are substantially same, and thus the technical features of forming the first pattern and forming the structural coloration layer are substantially same and any repetitive explanation will be omitted. That is, the first pattern is formed on the upper substrate or on the base substrate without the upper substrate, and at every case, the process of forming the first pattern and further processes of forming the structural coloration layer are substantially same and thus one of the cases will be explained for the convenience of explanation.

For example, referring to FIG. 1 and FIG. 2A, in forming the first pattern 30 on the base substrate 10, the upper substrate 20 may be disposed on the base substrate 10 (step S12).

Here, the upper substrate 20 is a transparent substrate, and may include a non-metallic material such as a glass, silicon and so on, or a metallic material such as sliver, aluminum and so on. On the upper substrate 20, the subsequent processes like forming the quantum dot or stacking the structural coloration layer are performed, and thus the upper substrate 20 may also include the materials or may be surface-treated for performing the subsequent processes more efficiently.

Then, referring to FIG. 1 and FIG. 2A, in forming the first pattern 30 on the base substrate 10, the first pattern 30 displaying the first color A may be formed on the upper substrate 20 using the quantum dot (step S13).

Here, the first pattern 30, as explained above, may be directly formed on the base substrate 10, and thus a structure, an arrangement, a material and so on of the first pattern 30 are substantially same as the first pattern 30 for the process of forming the first pattern 30 directly formed on the base substrate 10.

In FIG. 2A, the first pattern 30 may be embedded in an inside from an upper surface of the upper substrate 20. To form the embedded first pattern 30, the quantum dot is imprinted into the inside of the upper substrate 20 and then a doctoring is performed on the surface of the upper substrate 20, or a groove for the first pattern 30 is formed on the upper substrate 20 and then the quantum dot is filled with the groove via a capillary phenomenon.

Alternatively, although not shown in the figure, the first pattern 30 may be formed to be protruded from the upper substrate 20. To form the protruded quantum dot pattern, the quantum dot may be printed on the upper substrate 20 via a printing process, or the quantum dot may be selectively coated on the upper substrate 20 via a mask pattern.

The first pattern 30 formed via the above-mentioned process, as illustrated in FIG. 2D, may be a longitudinal pattern extending along a line on an upper surface of the upper substrate 20. Alternatively, although not shown in the figure, the first pattern 30 may be a dot pattern, a checkerboard pattern and so on. In addition, the distance between the patterns may be uniform or different from each other, and in the dot pattern, each dot may have a circular shape or various kinds of shapes.

Accordingly, as the shape or the arrangement of the first pattern 30 may be changed variously, and thus a security pattern explained below of the structural coloration substrate may be more complicated, to improve the security.

As illustrated in FIG. 2D, when the first pattern 30 is the longitudinal pattern extending the direction, the first pattern 30 may display the first color A externally.

Thus, the base substrate 10 on which the first pattern 30 is formed, may display the first color A and a second color B different from the first color A alternately.

Although not shown in the figure, the upper substrate 20 may be omitted and the first pattern 30 may be directly formed on the base substrate 10 using the quantum dot, and thus the color displayed externally may be alternately changed by the first color A and the second color B, as illustrated in FIG. 2D.

Then, referring to FIG. 1 and FIG. 2B, at least one structural coloration layer 40 is stacked on the upper substrate 20 or the base substrate 10 (when the upper substrate 20 is omitted) on which the first pattern 30 is formed (step S14).

The structural coloration layer 40 stacked is at least one, and thus as each of the structural coloration layer 40 is stacked, the color displayed externally may be changed.

Each of the at least one structural coloration layer 40 may include $TiO_2$ or $Al_2O_3$. For example, a first layer of the stacked structural coloration layers includes $TiO_2$, a second layer thereof on the first layer includes $Al_2O_3$, and a third layer thereof on the second layer includes $TiO_2$. Here, the combination of the materials of the structural coloration layer may be variously changed.

In addition, for example, each of the at least one structural coloration layer may be formed via an atomic layer deposition (ALD), and thus, each of the structural coloration layer may be stacked with a relatively fine thickness in a range of tens of nano meters. Further, even though the first pattern 30 is protruded from the upper substrate 20, regardless of the shape of the first pattern, the thickness of the structural coloration layer may be formed with a relatively fine thickness.

Accordingly, the security substrate manufactured by the method according to the present example embodiment, may have the relatively fine thickness, and thus the security substrate may have more enhanced usability and security.

Alternatively, to increase the productivity and the efficiency of the process, each of the structural coloration layer may be stacked or formed via a thin film coating process such as a chemical vapor deposition (CVD), an evaporation, a coating and so on.

As the at least one structural coloration layer 40 is stacked, as illustrated in FIG. 2E, the color displayed externally due to the structural coloration layer is changed. For example, the second color B displayed by the base substrate 10 may be changed to be a fourth color C different from the second color B, as the structural coloration layer 40 is stacked. In addition, the first color A displayed by the first pattern 30 may be changed to be a third color A' different from the first color A, as the structural coloration layer 40 is stacked.

However, since the third color A' is different from the fourth color C, as illustrated in FIG. 2E, in the pattern displayed externally, the third color A' and the fourth color C are arranged alternately.

Here, the colors exampled as in FIG. 2D and FIG. 2E, may be variously changed according to the material of the structural coloration layer, the number of the stacked structural coloration layers, and so on. In addition, the colors may be variously changed according to a direction of an incident light or a viewing angle for the structural coloration layer.

However, since the first pattern 30 is included, even though the colors displayed externally are changed, the pattern displayed externally is maintained to include the colors different from each other which are alternately changed. Thus, information on the pattern and the color may be encrypted and the structural coloration layer may be verified based on the encrypted information on the pattern and the color.

Referring to FIG. 1 and FIG. 2C, a protective layer 50 is coated on an upper surface of the structural coloration layer 40 (step S15). Here, the structural coloration layer 40 substantially means the at least one structural coloration layer, but for the convenience of the explanation, hereinafter, the structural coloration layer is used to mean the at least one structural coloration layer.

The protective layer 50 may be coated on the upper surface of the structural coloration layer 40 with a minimized thickness for protecting the damage of the structural coloration layer 40, via the thin film coating process.

The protective layer 50 is formed to prevent the structural coloration layer 40 from being damaged, and thus may include a transparent material. Thus, the protective layer 50 may protect the structural coloration layer 40 with the minimized thickness, so that the encrypted information on the color and the pattern may be prevented from being damage and the durability and the security of the structural coloration substrate may be enhanced.

Figure 4A:
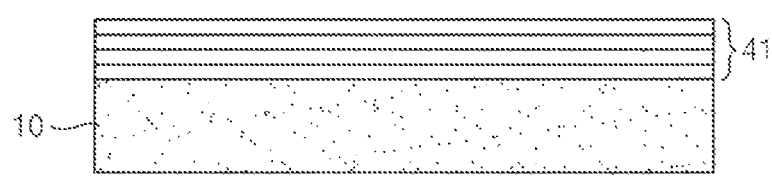
FIG. 4A, FIG. 4B and FIG. 4C are process views illustrating the method for manufacturing the structural coloration substrate of FIG. 3, and FIG. 4D and FIG. 4E are plan views illustrating a pattern and a color displayed externally through the structural coloration substrate of FIG. 4B.
Figure 4B:
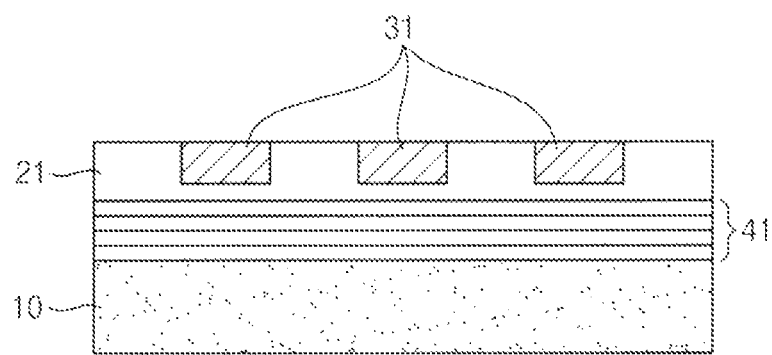
Figure 4C:
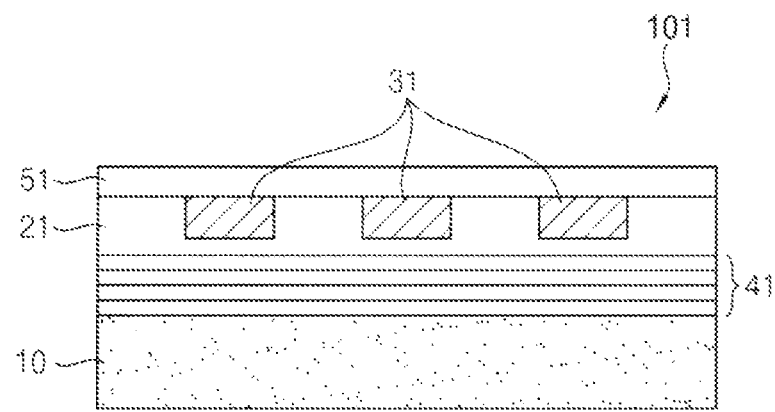
Figure 4D:
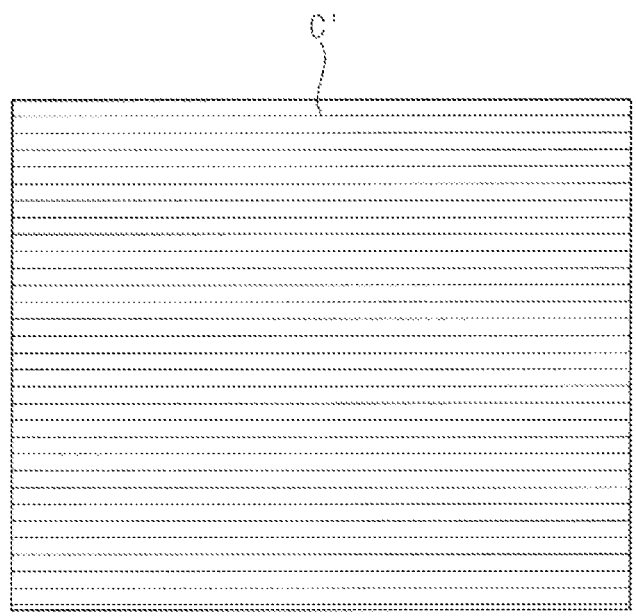
Figure 4E:
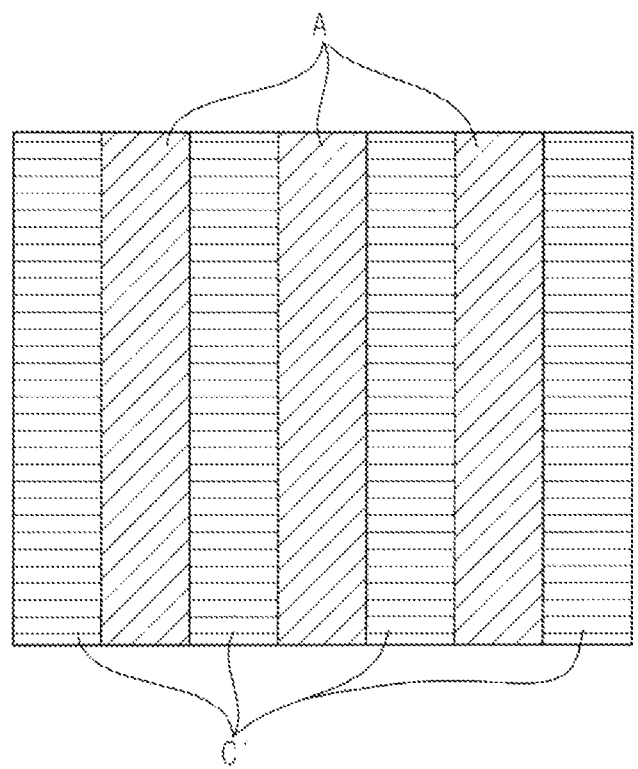

FIG. 3 is a flow chart illustrating a method for manufacturing a structural coloration substrate 101 according to another example embodiment of the present invention. FIG. 4A, FIG. 4B and FIG. 4C are process views illustrating the method for manufacturing the structural coloration substrate of FIG. 3, and FIG. 4D and FIG. 4E are plan views illustrating a pattern and a color displayed externally through the structural coloration substrate of FIG. 4B.

In the method according to the present example embodiment, the specific method and the specific process are different from the method for manufacturing the structural coloration substrate 100 according to the previous example embodiment referring to FIG. 1, but the material used for the method, the process of forming the first pattern using the quantum dot or the process of stacking the structural coloration layer are substantially same as the method in FIG. 1, and thus any repetitive explanation concerning the same technical features is omitted.

Referring to FIG. 3 and FIG. 4A, in the method for manufacturing the structural coloration substrate 101 according to the present example embodiment, at least one structural coloration layer 41 is stacked on the base substrate 10 (step S21).

The stacked structural coloration layer 41 is at least one layer, and the color displayed externally is changed according to the number of the stacked layers. The method for the stacking the layer and the material of the stacked layer are substantially same as in the method explained referring to FIG. 1.

Accordingly, as the structural coloration layer 41 is directly stacked on the base substrate 10, as illustrated in FIG. 4D, the second color B originally displayed by the base substrate 10 is changed to a fifth color C' by the structural coloration layer 41.

Here, since the structural coloration layer 41 is stacked over an entire surface of the base substrate 10, any additional pattern is not displayed externally and the same fifth color C' is displayed externally or outwardly. Here, when the viewing angle of the incident light incident into the base substrate 10 is changed, the fifth color C' may be changed and displayed.

Then, referring to FIG. 3, a first pattern 31 is formed on an upper surface of the structural coloration layer 41 using the quantum dot (step S22).

Here, as explained in the previous example embodiment, a thickness of the first pattern 31 formed using the quantum dot is relatively thin, and thus any additional upper substrate 21 may be omitted and then the first pattern 31 may be directly formed on the upper surface of the structural coloration layer 41.

Alternatively, the first pattern 31 may be formed on the upper substrate 31.

In addition, in any cases that the first pattern 31 is formed directly on the structural coloration layer 41 or on the upper substrate 21, the structure, the arrangement, the material and so on of the first pattern 31 may be substantially same as those explained in the previous example embodiment.

Referring to FIG. 3 and FIG. 4B, in forming the first pattern 31, the upper substrate 21 is formed on the upper surface of the structural coloration layer 41 (step S23), and the first pattern 31 is formed on the upper substrate 21 using the quantum dot (step S24).

Alternatively, the first pattern 31 may be formed on the upper substrate 21 using the quantum dot, and then the upper substrate 21 on which the first pattern 31 is formed may be attached or imprinted on the upper surface of the structural coloration layer 41.

The upper substrate 21 may be transparent, and the first pattern 31 formed using the quantum dot may display the first color A as explained above.

Here, in forming the first pattern 31 on the upper substrate 21, the upper substrate 21 on which the first pattern 31 is formed is disposed on the upper surface of the structural coloration layer 41, and thus, as illustrated in FIG. 4E, the first color A is displayed outwardly or externally in the position at which the first pattern 31 is formed.

Referring to FIG. 4E, the structural coloration layer 41 and the first pattern 31 overlap with each other, and thus the longitudinal pattern displaying the first color A and the longitudinal pattern displaying the fifth color C' are alternately arranged. Thus, the patterns having colors different from each other are displayed outwardly or externally.

Here, as the incident angle of the light incident into the structural coloration substrate is changed or as the viewing angle on the structural coloration substrate is changed, the color displayed externally may be changed. However, the alternately changed pattern of the longitudinal patterns respectively having the colors different from each other is uniformly maintained.

Accordingly, via the method for manufacturing the structural coloration substrate according to the present example embodiment, the structural coloration substrate having the complex patterns and colors may be manufactured. The information on the patterns and the colors may be encrypted, and the structural coloration substrate may be verified based on the encrypted information on the patterns and the colors.

Then, referring to FIG. 3 and FIG. 4C, a protective layer 51 is coated on an upper surface of the upper substrate 21 on which the first pattern 31 is formed (step S25).

The protective layer 51 may be coated on the upper surface of the structural coloration layer 40 with a minimized thickness for protecting the damage of the structural coloration layer 40, via the thin film coating process. Thus, the protective layer 51 may protect the first pattern 31, so that the encrypted information on the colors and the patterns may be prevented from being damage and the durability and the security of the structural coloration substrate may be enhanced.

Figure 5:
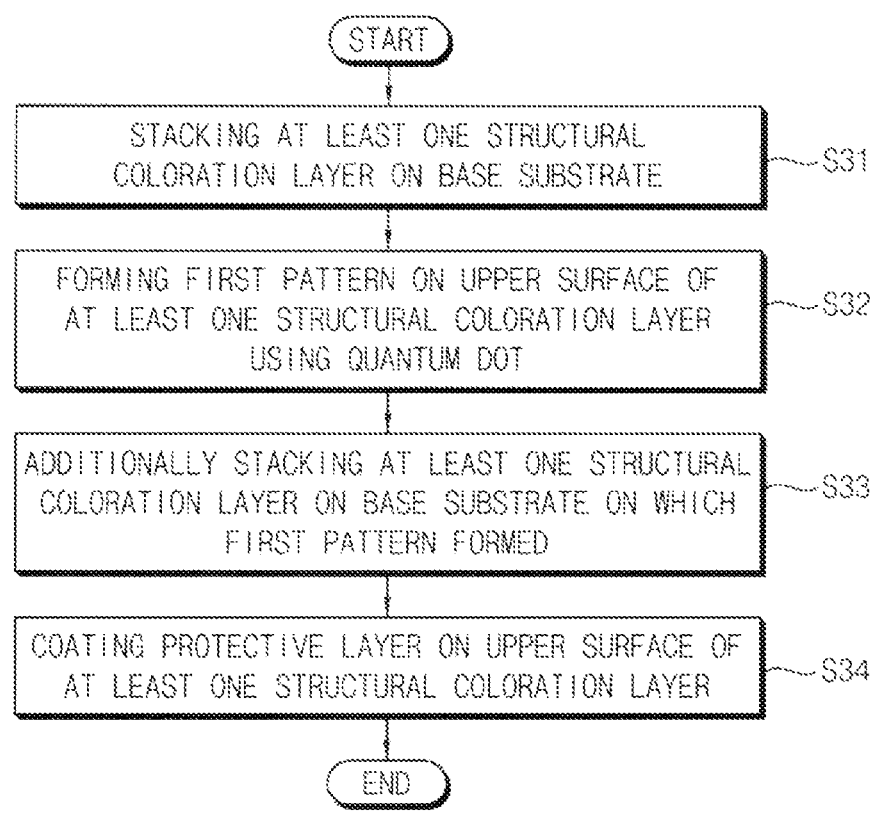
FIG. 5 is a flow chart illustrating a method for manufacturing a structural coloration substrate according to still another example embodiment of the present invention.
Figure 6A:
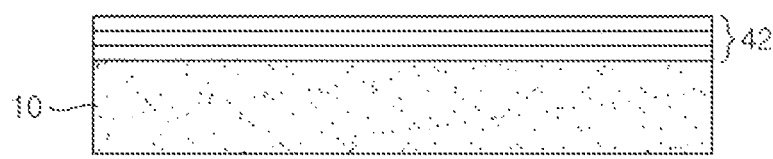
FIG. 6A, FIG. 6B and FIG. 6C are process views illustrating the method for manufacturing the structural coloration substrate of FIG. 5.
Figure 6B:
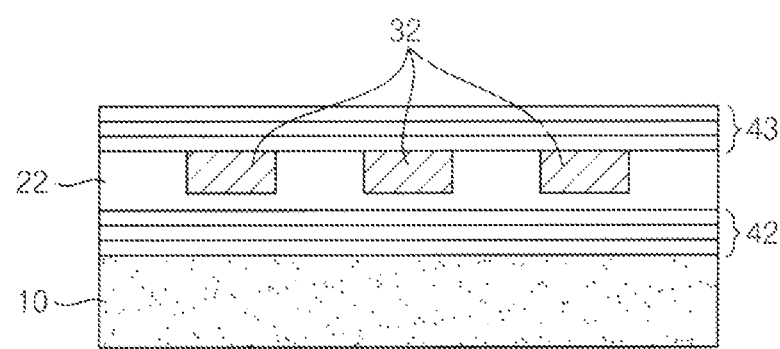
Figure 6C:
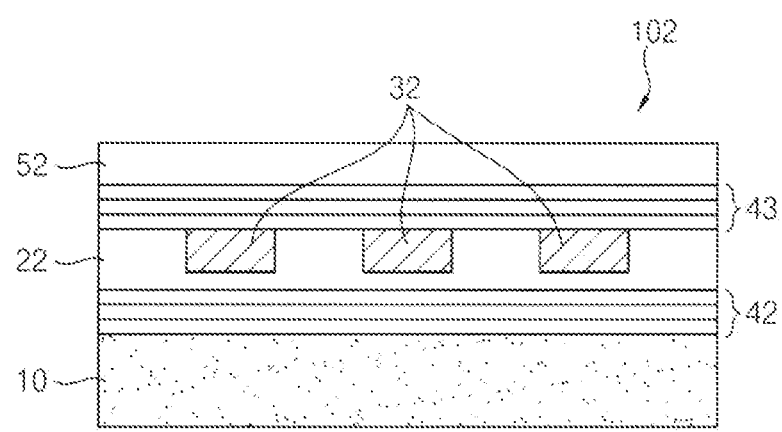

FIG. 5 is a flow chart illustrating a method for manufacturing a structural coloration substrate 102 according to still another example embodiment of the present invention. FIG. 6A, FIG. 6B and FIG. 6C are process views illustrating the method for manufacturing the structural coloration substrate of FIG. 5.

In the method according to the present example embodiment, the specific method and the specific process are different from the method for manufacturing the structural coloration substrate 100 according to the previous example embodiments referring to FIG. 1 and FIG. 3, but the material used for the method, and the process of stacking the structural coloration layer are substantially same as the method in FIG. 1 and FIG. 3, and thus any repetitive explanation concerning the same technical features is omitted.

Referring to FIG. 5 and FIG. 6A, in the method according the present example embodiment, at least one structural coloration layer 42 is stacked on the base substrate 10 (step S31).

The stacked structural coloration layer 42 is at least one layer, and the color displayed externally is changed according to the number of the stacked layers. The method for the stacking the layer and the material of the stacked layer are substantially same as in the method explained referring to FIG. 1.

Here, the structural coloration layer 42 is stacked over an entire area of the base substrate 10, and thus the color originally displayed by the base substrate 10 is changed by the structural coloration layer 42 and is displayed externally.

Then, referring to FIG. 5 and FIG. 6B, a first pattern 32 is formed on an upper surface of the structural coloration layer 42 using the quantum dot (step S22).

Here, as explained above, the first pattern 32 formed using the quantum dot has a relatively thinner thickness, and thus any additional upper substrate 22 may be omitted and the first pattern 32 may be directly formed on an upper surface of the structural coloration layer 42.

Alternatively, the first pattern 32 may be formed on the upper substrate 22.

In addition, in cases that the first pattern 32 is directly formed on the structural coloration layer 42 or the first pattern 32 is formed on the upper substrate 22, the technical features such as the structure, the arrangement, the material and so on of the first pattern 32 are substantially same as explained above.

In forming the first pattern 32, the upper substrate 22 is disposed on the upper surface of the structural coloration layer 42, and the first pattern 32 may be formed on the upper substrate 22 using the quantum dot.

As the first pattern 32 is formed on the upper surface of the structural coloration layer 42, the color displayed by the first pattern 31 is displayed externally at the position in which the first pattern 31 is formed.

Then, referring to FIG. 5 and FIG. 6B, at least one structural coloration layer 43 is additionally stacked on the base substrate 10 on which the first pattern 32 is formed (step S33).

Here, the additionally stacked structural coloration layer 43 is at least one layer, and thus the first pattern 32 is interposed between the plurality of the structural coloration layers 42 and 43.

In addition, the material of the additionally stacked structural coloration layer 43 may be selected considering the material of the previously stacked structural coloration layer 42, and thus various kinds of colors may be displayed externally due to the structural coloration layer.

As the structural coloration layer 43 is additionally stacked, the color displayed due to the previously stacked structural coloration layer 42 is changed, and the color displayed due to the first pattern 32 is also changed. However, the color displayed at the position in which the first pattern 32 is formed, is different from the color displayed at the position in which the structural coloration layers 42 and 43 overlap with each other.

Thus, more various kinds of colors may be displayed outwardly.

Then, referring to FIG. 5 and FIG. 6C, a protective layer 52 is coated on an upper surface of the structural coloration layer 43 (step S34). Here, the coating of the protective layer 52 is substantially same as the coating of the protective layer mentioned above, and thus any repetitive explanation is omitted.

Figure 7:
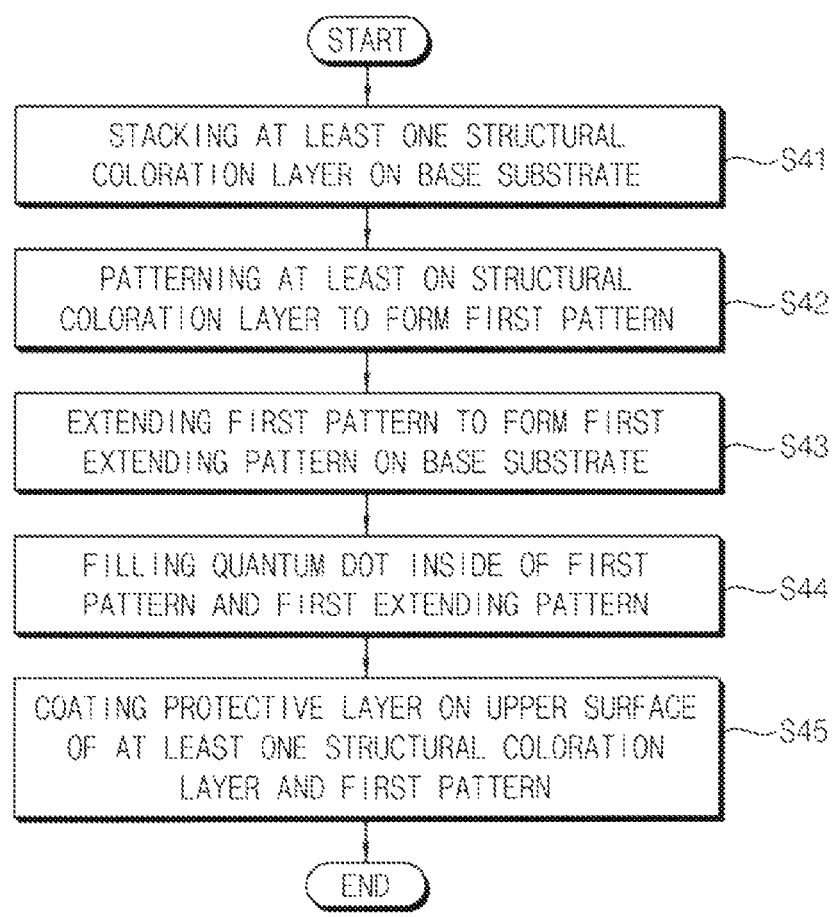
FIG. 7 is a flow chart illustrating a method for manufacturing a structural coloration substrate according to still another example embodiment of the present invention.

FIG. 7 is a flow chart illustrating a method for manufacturing a structural coloration substrate 103 according to still another example embodiment of the present invention. FIG. 8A, FIG. 8B, FIG. 8C, FIG. 8D, FIG. 8E, FIG. 8F and FIG. 8G are process views illustrating the method for manufacturing the structural coloration substrate of FIG. 7.

In the method according to the present example embodiment, the specific method and the specific process are different from the method for manufacturing the structural coloration substrate according to the previous example embodiments referring to FIG. 1, FIG. 3 and FIG. 5, but the material used for the method, and the process of stacking the structural coloration layer are substantially same as the method in FIG. 1, FIG. 3 and FIG. 5, and thus any repetitive explanation concerning the same technical features is omitted.

Figure 8A:
FIG. 8A, FIG. 8B, FIG. 8C, FIG. 8D, FIG. 8E, FIG. 8F and FIG. 8G are process views illustrating the method for manufacturing the structural coloration substrate of FIG. 7.

Referring to FIG. 7 and FIG. 8A, in the method according to the present example embodiment, at least one structural coloration layer 44 is stacked on the base substrate (step S41).

The stacked structural coloration layer 44 is at least one layer, and the color displayed externally is changed according to the number of the stacked layers. The method for the stacking the layer and the material of the stacked layer are substantially same as in the method explained referring to FIG. 1.

As the structural coloration layer 44 is directly stacked on the base substrate 10, although not shown in the figure, the second color B originally displayed by the base substrate 10 is changed due to the structural coloration layer 44 and is displayed externally.

Here, the structural coloration layer 44 is stacked over an entire area of the base substrate 10, and thus any additional pattern is not displayed externally and same color is displayed externally. As explained above, as the angle of the incident light into the base substrate 10 is changed, the color may be changed and displayed.

Figure 8B:
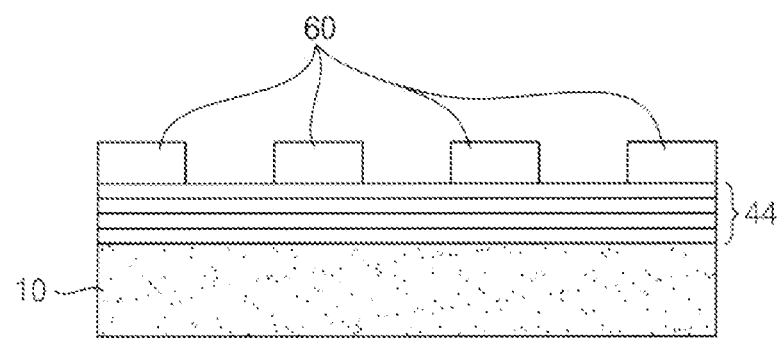
Figure 8C:
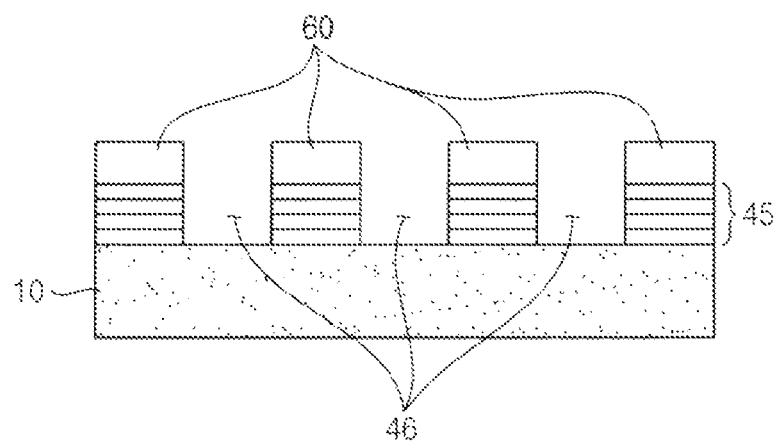

Then, referring to FIG. 7, FIG. 8B and FIG. 8C, a mask pattern 60 is disposed on the structural coloration layer 44, and the structural coloration layer 44 is patterned using the mask pattern 60 to form a first pattern 46 (step S42).

Here, the mask pattern 60 may include an opening at which the first pattern 46 is formed.

For example, the first pattern 46 may be formed via a photolithography or an etching and so on.

The mask pattern 60 may be a mask absorbing the light or blocking the light, and thus as the mask pattern 60 absorbs or blocks the light, the structural coloration layer 44 is patterned to be a structural coloration pattern 45 having the first pattern 46. Here, the portions at which the first pattern 46 is not formed are not cured and additional removing processes may be performed to remove the portions.

Alternatively, the mask pattern 60 may act as an etch stopper, and thus the structural coloration layer 44 is selectively etched to be formed as the structural coloration pattern 45 having the first pattern 46.

Figure 8D:
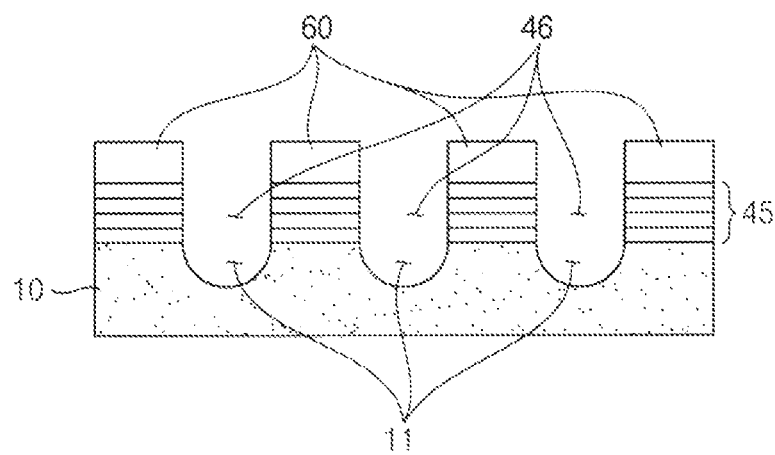

Then, referring to FIG. 7 and FIG. 8D, the first pattern 46 is extended to form a first extending pattern 11 extending from the first pattern 46 on the base substrate 10 (step S43).

The first extending pattern 11 may be formed via the photolithography or the etching and so on.

The mask pattern 60 absorbs the light or blocks the light with the structural coloration pattern 45, and thus as the absorption or the blocking of the light, the base substrate 10 is patterned and then the first extending pattern 11 extending from the first pattern 46 with the same pattern is formed. Here, the portions at which the first extending pattern 11 is formed are not cured, and additional removing processes may be performed to remove the portions.

The first extending pattern 11 is formed inside of the base substrate 10, and the depth of the first extending pattern 11 inside of the base substrate 10 may be variously selected or controlled.

Alternatively, the mask pattern 60 may be the etch stopper with the structural coloration pattern 45, and thus the base substrate 10 is selectively etched and then the first extending pattern 11 extending from the first pattern 46 is formed inside of the base substrate 10.

Figure 8E:
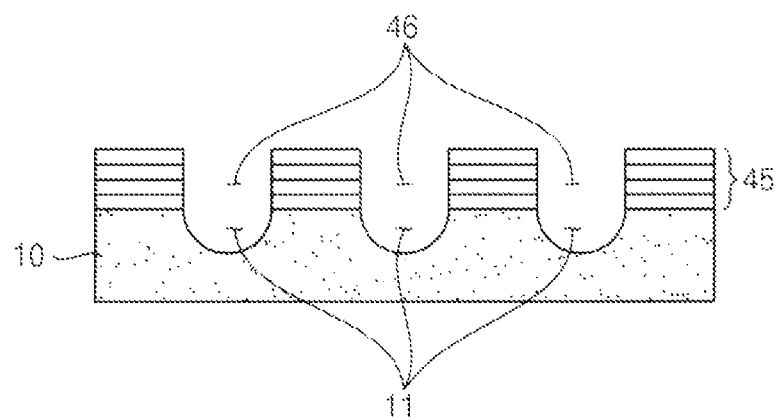

Then, referring to FIG. 7 and FIG. 8E, the mask pattern 60 is removed from the structural coloration pattern 45.

Figure 8F:
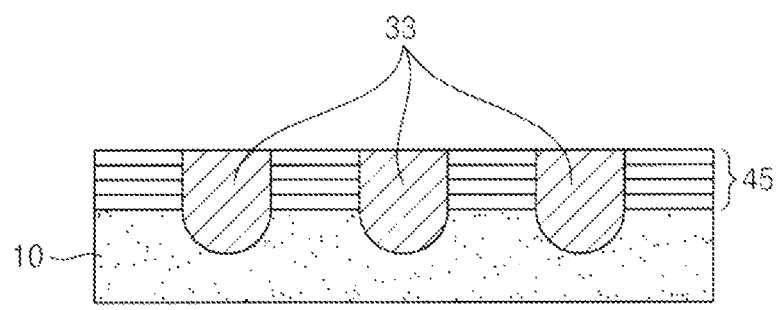
Figure 8G:
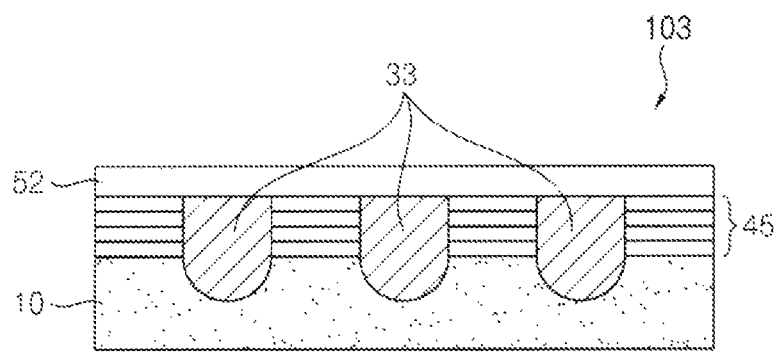

Then, referring to FIG. 7 and FIG. 8F, a quantum dot 32 is filled into the first pattern 46 and the first extending pattern 11 (step S44).

In filling the quantum dot 32 inside of the first pattern 46 and the first extending pattern 46, as explained above, the quantum dot may be filled via the capillary phenomenon, or the quantum dot may be imprinted into the first pattern 46 and the first extending pattern 11 and then the doctoring may be performed on the surface.

Accordingly, as the quantum dot 32 is filled into the first pattern 46 and the first extending pattern 11, the first pattern 46 having the quantum dot displays the first color A of the quantum dot 32 externally.

Thus, in the structural coloration substrate according to the present example embodiment, the first color A is displayed in the area where the first pattern 46 is formed, and the color of the structural coloration layer 44 is displayed in the area where the first pattern 46 is not formed.

Here, as explained above, the color displayed externally may be changed according to the angle of the incident light or the viewing angle. However, the color displayed in the area where the first pattern 46 is formed is different from the color displayed in the area where the first pattern 46 is not formed.

Accordingly, via the method for manufacturing the structural coloration substrate according to the present example embodiment, the structural coloration substrate having the complex patterns and colors may be manufactured. The information on the patterns and the colors may be encrypted, and the structural coloration substrate may be verified based on the encrypted information on the patterns and the colors.

Figure 9:
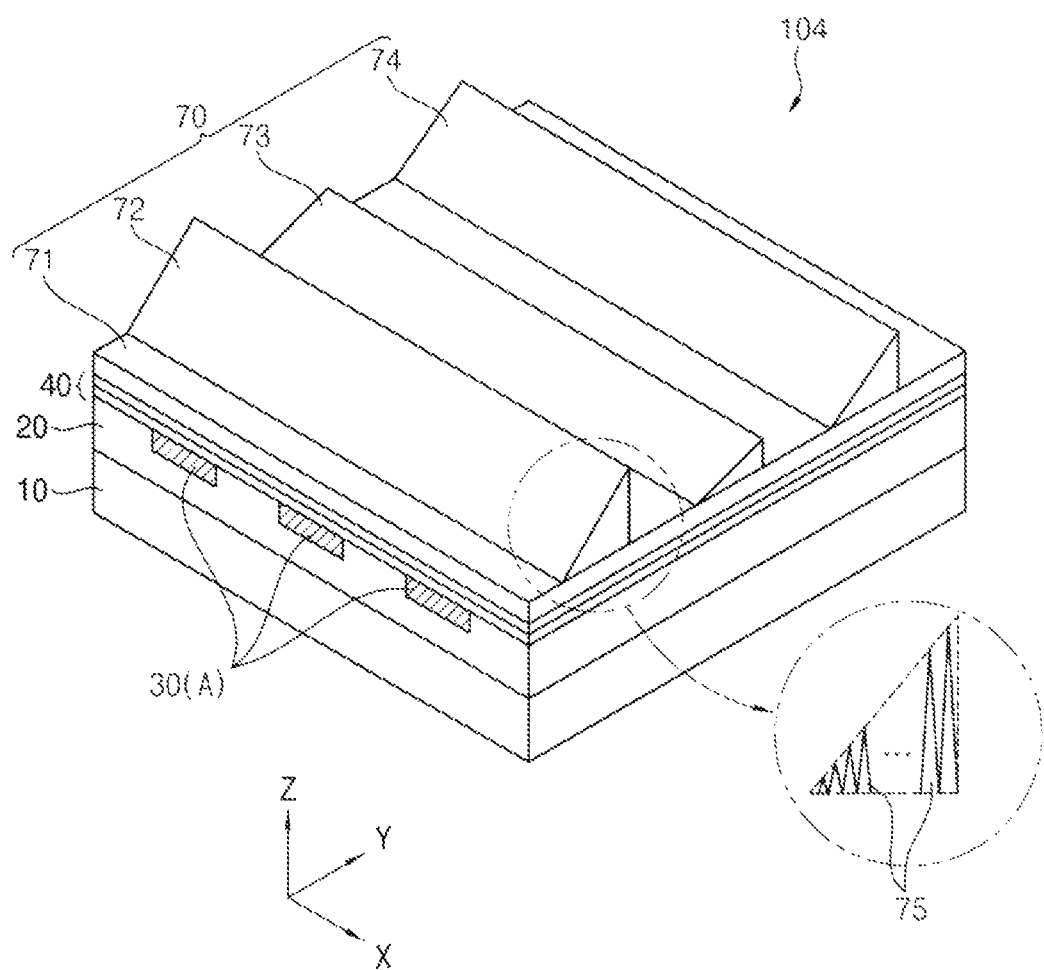
FIG. 9 is a perspective view illustrating a structural coloration substrate according to still another example embodiment of the present invention.
Figure 10:
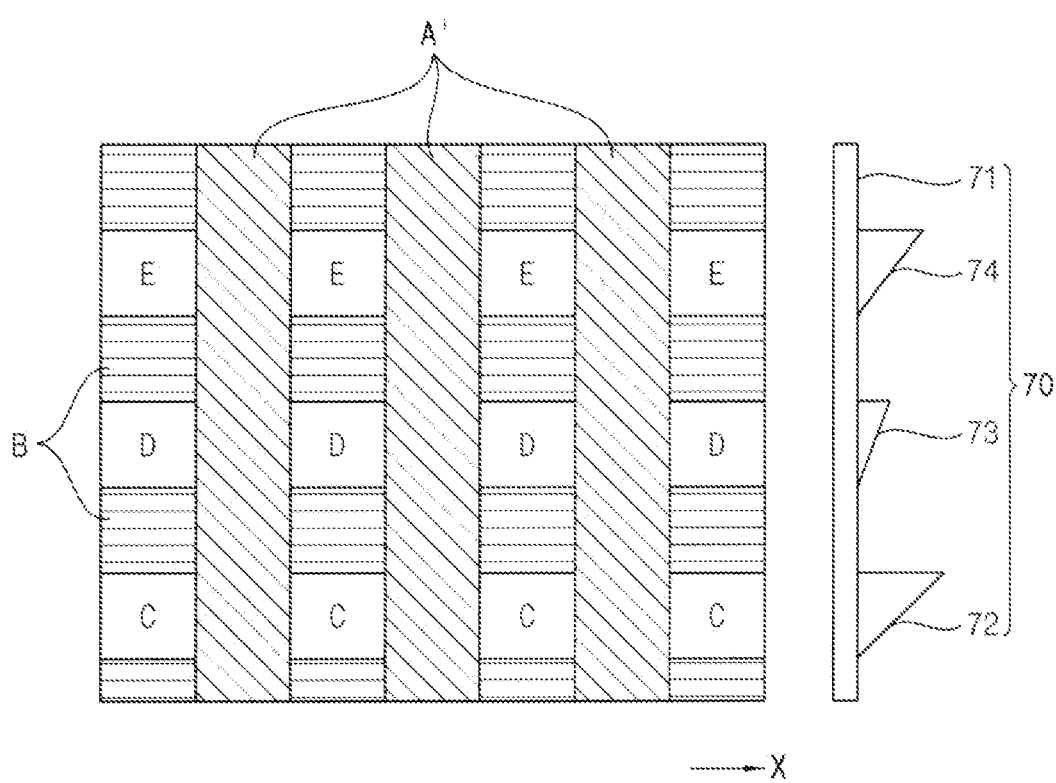
FIG. 10 is a schematic view illustrating a color displayed externally through a light conversion structure included by the structural coloration substrate of FIG. 9.

FIG. 9 is a perspective view illustrating a structural coloration substrate according to still another example embodiment of the present invention. FIG. 10 is a schematic view illustrating a color displayed externally through a light conversion structure included by the structural coloration substrate of FIG. 9. Here, in FIG. 10, a cross-section view of the light conversion structure 70 is additionally illustrated for the convenience of the explanation.

Referring to FIG. 9 and FIG. 10, the structural coloration substrate 104 according to the present example embodiment includes a base substrate 10, a first pattern 30 (or an upper substrate 20 at which the first pattern 30 is formed), at least one structural coloration layer 40 and a light conversion structure 70.

The base substrate 10 may include a black color or a black-based color. Thus, when no layer is formed on the base substrate 10, the black color may be displayed externally due to the base substrate 10. However, in the present example embodiment, additional layers are formed or stacked on the base substrate 10 and thus the color displayed externally may be changed.

In FIG. 9, the upper substrate 20 is disposed on the base substrate 10, and the first pattern 30 is formed on the upper substrate 20. Alternatively, the upper substrate 20 may be omitted and the first pattern 30 is formed on the base substrate 10. Here, the thickness of the first pattern is relatively thin, and thus even though the upper substrate 20 is omitted, the processes or the alignment for forming the structural coloration layer 40 may be performed without any problem.

Thus, in the present example embodiment, the case that the first pattern 30 is formed on the upper substrate 20 and the case that the first pattern 30 is formed on the base substrate 10 without the upper substrate 20 are explained.

Further, in following example embodiments, the above two cases may be applied or may be included, even though the drawings are omitted for one of the two cases.

Thus, in the present example embodiment and in the following example embodiments, the first pattern 30 may be formed on the base substrate 10 alone without the upper substrate 20 and may be also formed on the upper substrate 20 disposed on the base substrate 10, and "the upper substrate 20 on which the first pattern 30 is formed" means that the first pattern 30 is formed on the upper substrate 20 disposed on the base substrate 10.

The upper substrate 20 may be transparent, and the structure or the material thereof is substantially same as mentioned above.

The quantum dot is formed as the first pattern 30 on the upper substrate 20.

Here, the first pattern 30, as illustrated in FIG. 9, is the embedded pattern formed inside of the upper surface of the upper substrate 20, and the method forming the embedded pattern is substantially same as mentioned above.

Further, the upper substrate 20 may be omitted, and then the first pattern 30 is directly formed on the base substrate 10 using the quantum dot.

As illustrated in FIG. 10, the first pattern 30 may be formed on the upper substrate 20 or may be formed on the base substrate 10 without the upper substrate 20. The first pattern 30 may be one of a longitudinal pattern, a dot pattern, a checkerboard pattern and so on. In addition, the distance between the first patterns adjacent to each other may be uniform or different from each other, and the dot in the dot pattern may include a circular shape but not limited thereto.

The first pattern 30 includes the quantum dot, and the first pattern 30 displays the first color A outwardly or externally.

At least one structural coloration layer 40 is stacked on the upper surface of the upper substrate 20. Here, according to the number of the stacked structural coloration layers 40, the color displayed externally may be changed, and thus the number of the stacked layers may be changed considering the color displayed.

When the upper substrate 20 is omitted, the structural coloration layer 40 may be directly formed on the first pattern 30, and the numbers of the stacked layers or the processes forming the stacked layers are substantially same as the case that the upper substrate 20 exits.

The number of the stacked structural coloration layers 40 is same all over the entire surface of the upper substrate 20.

Here, the material and the method for forming the structural coloration layer 40 are substantially same as explained above.

As illustrated in FIG. 10, when the second color B is displayed externally due to the at least one structural coloration layer 40 is stacked, the first pattern 30 displaying the first color A is changed into a first' color A' due to the structural coloration layer 40.

The light conversion structure 70 is formed on the structural coloration layer 40, and includes a base frame 74 and at least one structure 72, 73 and 74 disposed on the base frame 71.

The base frame 71 has the height substantially same all over the structural coloration layer 40, and the at least one structure 72, 73 and 74 is formed on the base frame 71 with a predetermined pattern.

Here, the base frame 71 and the structure 72, 73 and 74 are integrally formed with each other, and then are disposed or formed on the structural coloration layer 40. Here, the structure 72, 73 and 74 may be formed to be protruded from the upper surface of the base frame 71.

For example, the light conversion structure 70 may be manufactured via a fine pattern manufacturing process such as the imprinting, and then the light conversion structure 70 may be formed on the structural coloration layer 40 via an attaching process.

In FIG. 9, three structures 72, 73 and 74 different from each other are illustrated as an example, but the number, the alignment and the shape of the structures 72, 73 and 74 may be variously changed or selected.

For example, as illustrated in FIG. 9, the structure includes a first structure 72 extending along a first direction X, a second structure 73 extending along the first direction X and being spaced apart from and parallel with the first structure 72 along a second direction Y perpendicular to the first direction X, and a third structure 74 extending along the first direction X and being spaced apart from and parallel with the second structure 73 along the second direction Y.

In addition, each of the first to third structures 72, 73 and 74 has a cross-sectional shape of a triangle along a YZ plane which is formed along a third direction Z perpendicular to the first and second directions X and Y, and triangular shapes of the first to third structures 72, 73 and 74 may be different from each other as illustrated in FIG. 9.

For example, as illustrated in FIG. 9 and FIG. 10, each of the first to third structures 72, 73 and 74 has the cross-sectional shape of a right-angled triangle, but a base and a height of each of the first to third structures 72, 73 and 74 may be different from each other.

Accordingly, all of the first to third structures 72, 73 and 74 have the cross-sectional shape of the triangle, and each of the first to third structures 72, 73 and 74 has a sub-triangular shape 75 as illustrated in FIG. 9.

Here, a plurality of the sub-triangular shapes 75 is tightly attached with each other, to form the cross-section shape of the first structure 72 as the right-angled triangular shape in a whole, and likewise, each of the second and third structures 73 and 74 has a plurality of sub-triangular shapes tightly attached with each other.

Further, in the following example embodiments, each structure included in the light conversion structure mentioned below includes a plurality of sub-triangular shapes tightly attached with each other to form a triangular shape or a predetermined shape in a whole, regardless of the structure being protruded or being concaved. That is, the plurality of sub-triangular shapes tightly attached with each other forms an entire shape of the structure.

The light conversion structure 70 may include a transparent material.

Thus, the light passing through the base frame 71 in the light conversion structure 70 merely transmits without refraction, and thus the color displayed under the base frame 71 is maintained outwardly.

However, the light passing through the structures 72, 73 and 74 of the light conversion structure 70 is refracted differently according to the shape of each of the structures 72, 73 and 74. Thus, the color displayed by the structures 72, 73 and 74 may be changed due to the structures 72, 73 and 74. Here, the displayed color may be different from each other, according to each of the structures 72, 73 and 74, since the refraction is changed according to the shape of each of the structures 72, 73 and 74.

As illustrated in FIG. 10, in the area in which the base frame 71 is merely disposed or positioned, the second color B representing the color of the structural coloration layer 40 is merely displayed.

However, in the area in which the structures 72, 73 and 74 are positioned or disposed, the colors displayed outwardly are changed according to the position of each of the structures 72, 73 and 74. For example, in the area in which the first structure 72 is positioned, the second color B may be changed into and displayed as a third color C. In the area in which the second structure 73 is positioned, the second color B may be changed into and displayed as a fourth color D. In the area in which the third structure 74 is positioned, the second color B may be changed into and displayed as a fifth color E.

In addition, when the first pattern 30 is formed under the light conversion structure 70 by the quantum dot, the first pattern 30 due to the quantum dot is changed into and displayed as a first' color A' by the structural coloration layer 40, and the refractive index is not changed due to the shape of each of the first to third structures 72, 73 and 74 so that the color is not changed and displayed as the first' color A'.

Thus, as illustrated in FIG. 10, the structural coloration substrate according to the present example embodiment has the complex patterns and colors displayed externally, and thus the imitation for the patterns and the colors may be impossible and the security may be enhanced. Thus, the information on the patterns and the colors may be encrypted, and the structural coloration substrate may be verified based on the encrypted information on the patterns and the colors.

Here, the example colors illustrated in FIG. 10 may be variously changed according to the number of the stacked structural coloration layers, the kinds of the patterns of the light conversion structures and so on. In addition, the example colors may also be changed according to the direction of the incident light and the viewing angle, as explained above.

Figure 11:
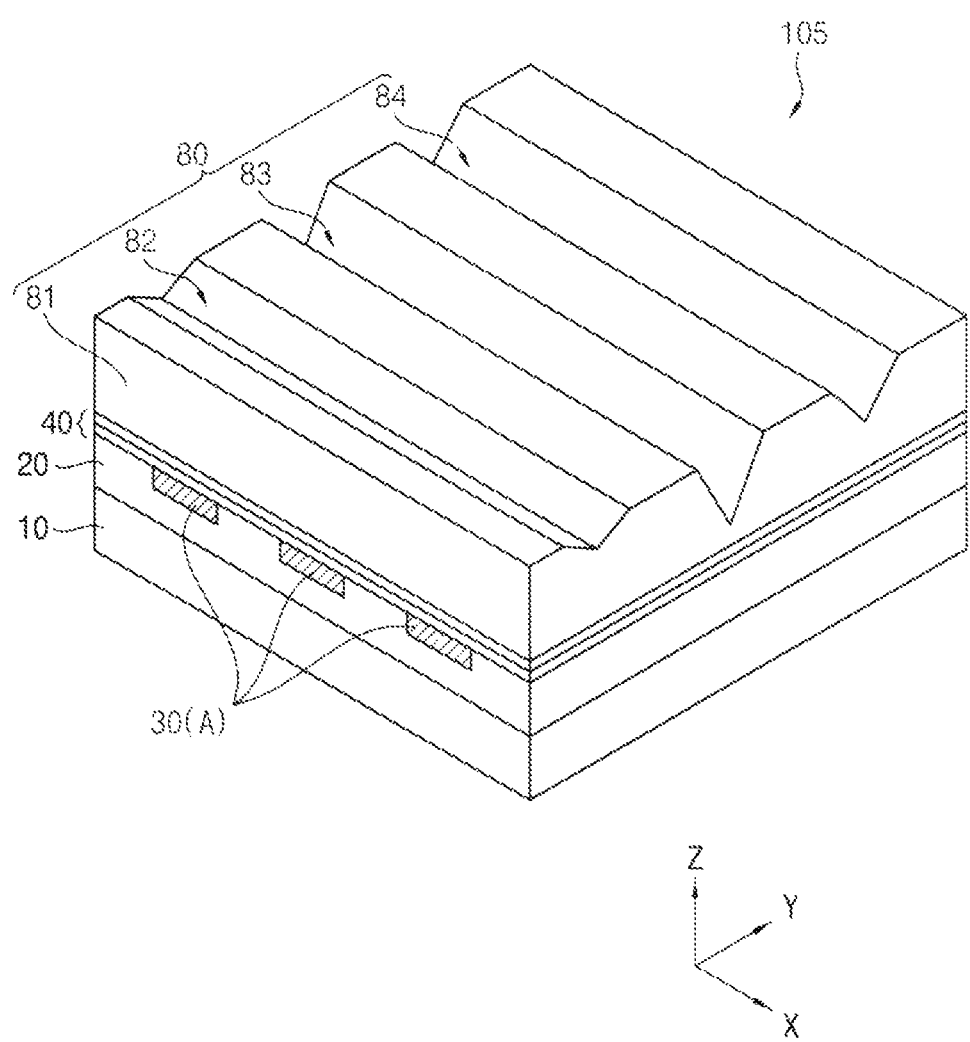
FIG. 11 is a perspective view illustrating a structural coloration substrate according to still another example embodiment of the present invention.
Figure 12:
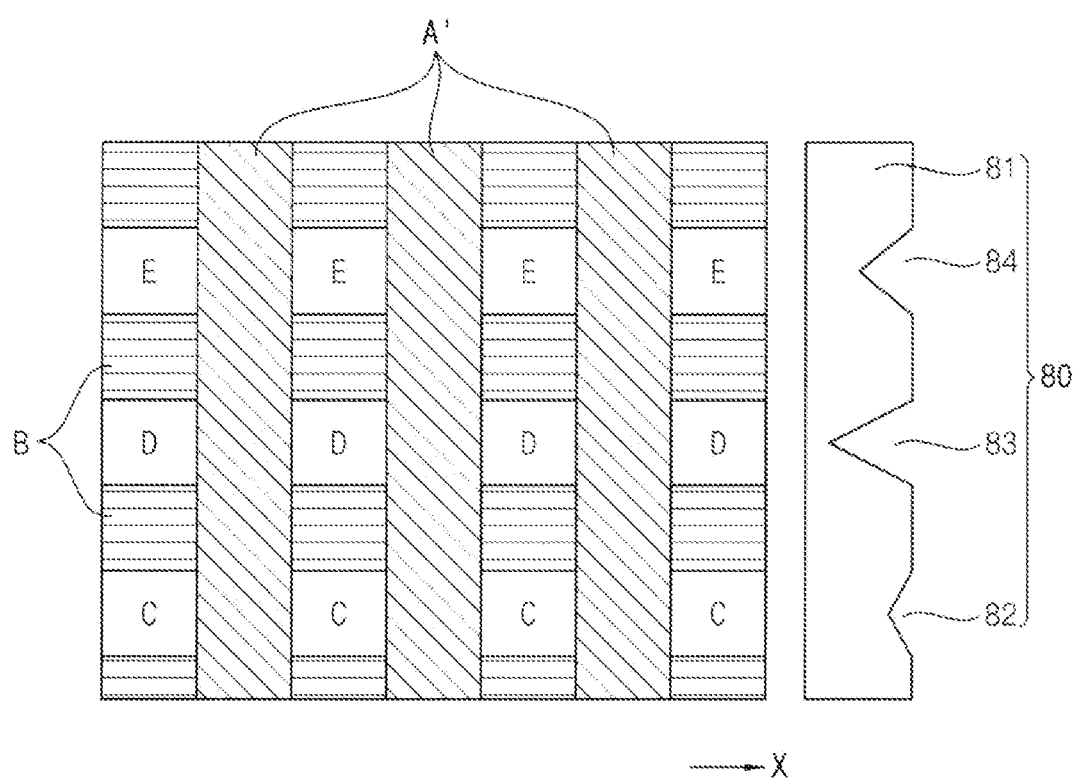
FIG. 12 is a schematic view illustrating a color displayed externally through a light conversion structure included by the structural coloration substrate of FIG. 11.

FIG. 11 is a perspective view illustrating a structural coloration substrate according to still another example embodiment of the present invention. FIG. 12 is a schematic view illustrating a color displayed externally through a light conversion structure included by the structural coloration substrate of FIG. 11. Here, the cross-sectional shape of the light conversion structure 80 is additionally illustrated in FIG. 12 for the convenience of the explanation.

The structural coloration substrate 105 according to the present example embodiment is substantially same as the structural coloration substrate 104 according to the previous example embodiment of FIG. 9 and FIG. 10, except for a shape of the light conversion structure 80, and thus any repetitive explanation concerning the same technical features is omitted.

Referring to FIG. 11 and FIG. 12, the structural coloration substrate 105 according to the present example embodiment includes a base substrate 10, a first pattern 30 (or an upper substrate 20 in which the first pattern 30 is formed), at least one structural coloration layer 40 and a light conversion structure 80, and the arrangement, the shape, the manufacturing process of each of the base substrate 10, the first pattern 30 or the upper substrate 20, and the structural coloration layer 40 are substantially same as mentioned above.

However, in the present example embodiment, the light conversion structure 80 includes a base frame 81, and at least one structure 82, 83 and 84 formed on the base frame 81, and at least one structure 82, 83 and 84 is formed concaved inside of the base frame 81.

For example, as illustrated in FIG. 11, the structure includes a first structure 82 extending along the first direction X and intruded or concaved into the base frame 81, a second structure 83 extending along the first direction X, spaced apart from the first structure 82 along the second direction Y and intruded or concaved into the base frame 81, and a third structure 84 extending along the first direction X, spaced apart from the second structure 83 along the second direction Y and intruded or concaved into the base frame 81.

In addition, each of the first to third structures 82, 83 and 84 has a cross-sectional shape of an intruded triangle along the YZ plane which is formed along the third direction Z, and the intruded triangular shapes of the first to third structures 82, 83 and 74 may be different from each other as illustrated in FIG. 11.

As illustrated in FIG. 11 and FIG. 12, each cross-sectional shape of the first to third structures 82, 83 and 84 is the triangle, and the intruded internal angles of the triangles of the first to third structures 82, 83 and 84 are different from each other.

Here, the light conversion structure 80 may be manufactured via a fine pattern manufacturing process such as the imprinting and so on, and then may be attached on the structural coloration layer 40 via an additional attaching process.

Thus, as explained above, the light passing through the base frame 81 merely transmits without the refraction, and the color displayed under the base frame 81 is maintained outwardly.

However, the light passing through the structures 82, 83 and 84 of the light conversion structure 80 is refracted differently according to the shape of each of the structures 82, 83 and 84. Thus, the color displayed by the structures 82, 83 and 84 may be changed due to the structures 82, 83 and 84. Here, the displayed color may be different from each other, according to each of the structures 82, 83 and 84, since the refraction is changed according to the intruded or concaved shape of each of the structures 82, 83 and 84.

As illustrated in FIG. 12, in the area in which the base frame 81 is merely disposed or positioned, the second color B representing the color of the structural coloration layer 40 is merely displayed.

However, in the area in which the structures 82, 83 and 84 are positioned or disposed, the colors displayed outwardly are changed according to the position of each of the structures 82, 83 and 84. For example, in the area in which the first structure 82 is positioned, the second color B may be changed into and displayed as the third color C. In the area in which the second structure 83 is positioned, the second color B may be changed into and displayed as the fourth color D. In the area in which the third structure 84 is positioned, the second color B may be changed into and displayed as the fifth color E.

In addition, when the first pattern 30 is formed under the light conversion structure 80 by the quantum dot, the first pattern 30 due to the quantum dot is changed into and displayed as a first' color A' by the structural coloration layer 40, and the refractive index is not changed due to the shape of each of the first to third structures 82, 83 and 84 so that the color is not changed and displayed as the first' color A'.

Thus, as illustrated in FIG. 12, the structural coloration substrate according to the present example embodiment has the complex patterns and colors displayed externally, and thus the imitation for the patterns and the colors may be impossible and the security may be enhanced. Thus, the information on the patterns and the colors may be encrypted, and the structural coloration substrate may be verified based on the encrypted information on the patterns and the colors.

Figure 13:
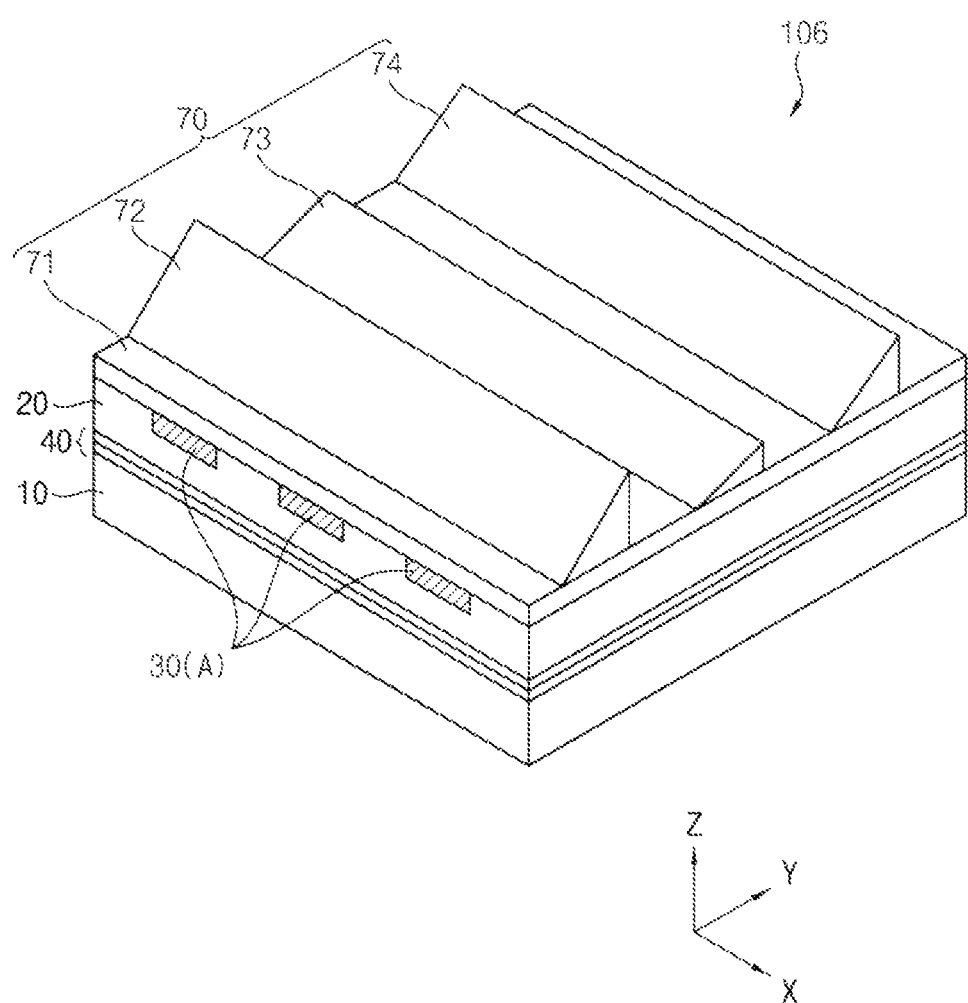
FIG. 13 is a perspective view illustrating a structural coloration substrate according to still another example embodiment of the present invention.
Figure 14:
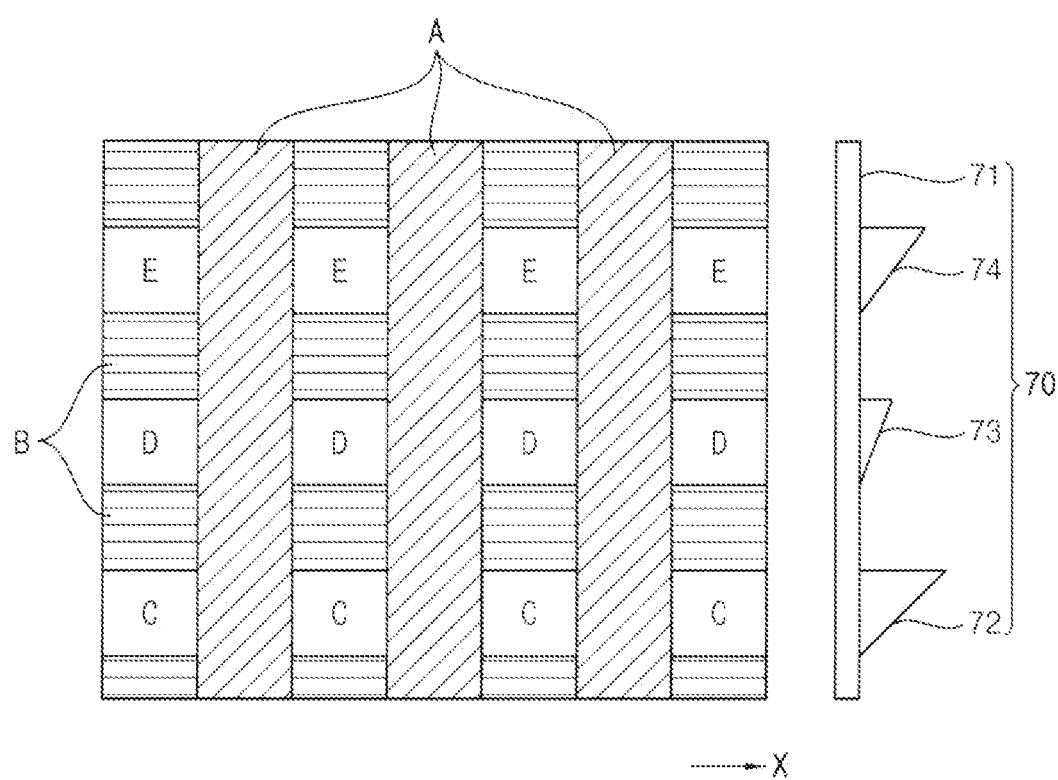
FIG. 14 is a schematic view illustrating a color displayed externally through a light conversion structure included by the structural coloration substrate of FIG. 13.

FIG. 13 is a perspective view illustrating a structural coloration substrate according to still another example embodiment of the present invention. FIG. 14 is a schematic view illustrating a color displayed externally through a light conversion structure included by the structural coloration substrate of FIG. 13. Here, the cross-sectional shape of the light conversion structure 70 is additionally illustrated in FIG. 14 for the convenience of the explanation.

The structural coloration substrate 106 according to the present example embodiment is substantially same as the structural coloration substrate 104 according to the previous example embodiment of FIG. 9 and FIG. 10, except for the disposition of the first pattern 30 (or the upper substrate 20 in which the first pattern 30 is formed) and the structural coloration layer 40, and thus any repetitive explanation concerning the same technical features is omitted.

Referring to FIG. 13 and FIG. 14, the structural coloration substrate 106 according to the present example embodiment includes a base substrate 10, a first pattern 30 (or an upper substrate 20 in which the first pattern 30 is formed), at least one structural coloration layer 40 and a light conversion structure 70, and the arrangement, the shape, the manufacturing process of the base substrate 10, the first pattern 30 or the upper substrate 20, the structural coloration layer 40 and the light conversion structure 70 are substantially same as mentioned above except for the first pattern 30 or the upper substrate 20 formed on the structural coloration layer 40.

Thus, in the present example embodiment, at least on structural coloration layer 40 is stacked on the base substrate 10 and the second color B is displayer outwardly or externally.

The first pattern 30 displays the first color A, and is formed on the upper surface of the structural coloration layer 40. Alternatively, the upper substrate 20 having the first pattern 30 displaying the first color A may be formed on the upper surface of the structural coloration layer 40.

Thus, as illustrated in FIG. 14, the first color A is displayed externally in the area in which the first pattern 30 is formed, and the second color B is displayed externally in the area in which the first pattern 30 is not formed.

Here, as the light conversion structure 70 is additionally formed on the first pattern 30 or on the upper substrate 20, the color displayed externally is changed in the area in which the structures 72, 73 and 74 of the light conversion structure 70 are additionally formed.

For example, as illustrated in FIG. 14, in the area in which the base frame 71 is merely disposed or positioned, the second color B representing the color of the structural coloration layer 40 is merely displayed.

However, in the area in which the structures 72, 73 and 74 are positioned or disposed, the colors displayed outwardly are changed according to the position of each of the structures 72, 73 and 74. For example, in the area in which the first structure 72 is positioned, the second color B may be changed into and displayed as the third color C. In the area in which the second structure 73 is positioned, the second color B may be changed into and displayed as the fourth color D. In the area in which the third structure 74 is positioned, the second color B may be changed into and displayed as the fifth color E.

In addition, when the first pattern 30 is formed under the light conversion structure 70 by the quantum dot, the refractive index of the first pattern 30 due to the quantum dot is not changed due to the shape of each of the first to third structures 72, 73 and 74 so that the color is not changed and displayed as the first color A.

Thus, as illustrated in FIG. 14, the structural coloration substrate 106 according to the present example embodiment has the complex patterns and colors displayed externally, and thus the imitation for the patterns and the colors may be impossible and the security may be enhanced. Thus, the information on the patterns and the colors may be encrypted, and the structural coloration substrate may be verified based on the encrypted information on the patterns and the colors.

Referring to FIG. 13, the structures of the light conversion structure 70 are protruded over the base frame, but alternatively, as explained referring to FIG. 11 and FIG. 12, the structures thereof may be intruded or concaved in the base frame.

Figure 15:
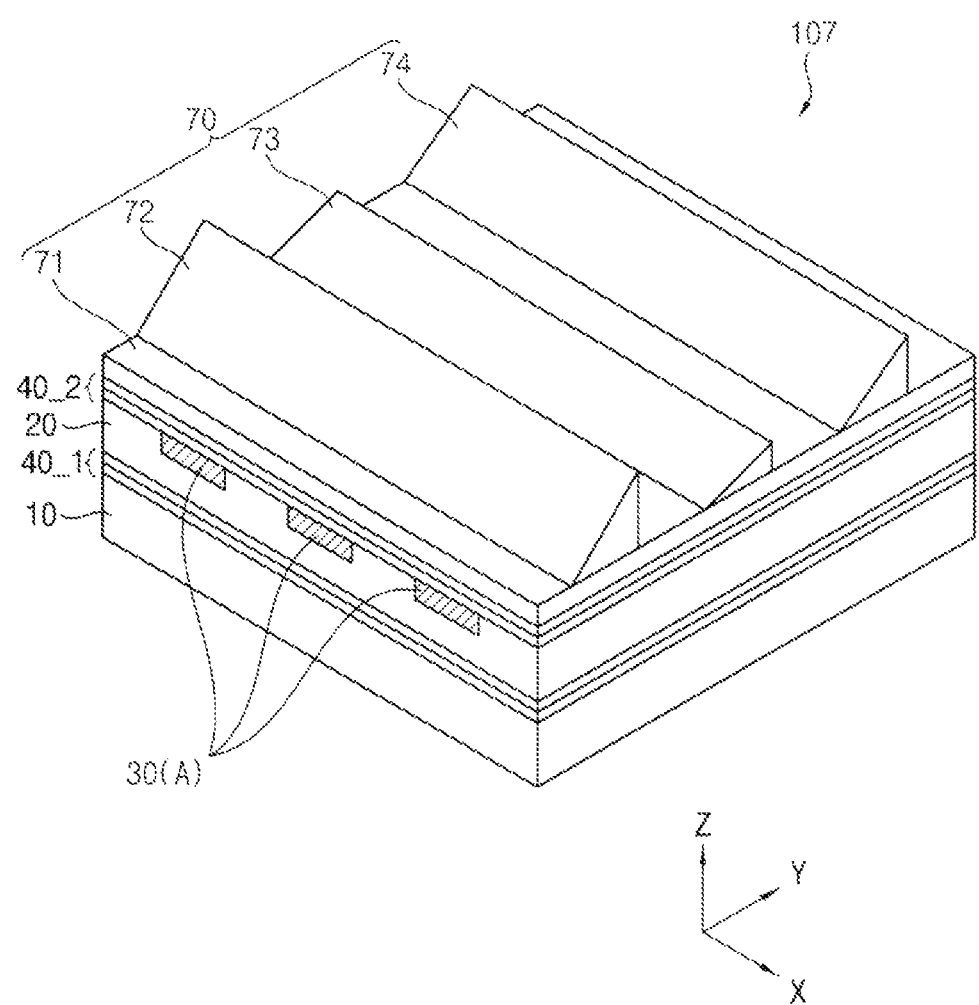
FIG. 15 is a perspective view illustrating a structural coloration substrate according to still another example embodiment of the present invention.

FIG. 15 is a perspective view illustrating a structural coloration substrate according to still another example embodiment of the present invention.

The structural coloration substrate 107 according to the present example embodiment is substantially same as the structural coloration substrate 106 according to the previous example embodiment of FIG. 13, except for a structural coloration layer 40_2 additionally formed on the first pattern 30 (or the upper substrate 20 in which the first pattern 30 is formed), and thus any repetitive explanation concerning the same technical features is omitted.

Referring to FIG. 15, the structural coloration substrate 107 according to the present example embodiment includes a base substrate 10, at least one structural coloration layer 40_1, a first pattern 30 (or an upper substrate 20 in which the first pattern 30 is formed), at least one additional structural coloration layer 40_2, and a light conversion structure 70, and the arrangement, the shape, the manufacturing process of each of the base substrate 10, the first pattern 30 or the upper substrate 20, and the structural coloration layers 40_1 and 40_2 are substantially same as mentioned above except for the additional structural coloration layer 40_2 additionally formed on the first pattern 30 or the upper substrate 20.

In the present example embodiment, the first pattern 30 or the upper substrate 20 on which the first pattern 30 is formed, is disposed between the at least one structural coloration layer 40_1 and the at least one additional structural coloration layer 40_2.

Here, the structural coloration layer 40_1 may be formed as a plurality of layers, and the additional structural coloration layer 40_2 may also be formed as a plurality of layers. However, the number of the stacked layers 40_1 may be same as or different from the number of the stacked layers 40_2.

Thus, the structural coloration substrate 107 according to the present example embodiment has the complex patterns and colors displayed externally and thus the imitation for the patterns and the colors may be impossible and the security may be enhanced. Thus, the information on the patterns and the colors may be encrypted, and the structural coloration substrate may be verified based on the encrypted information on the patterns and the colors.

Figure 16:
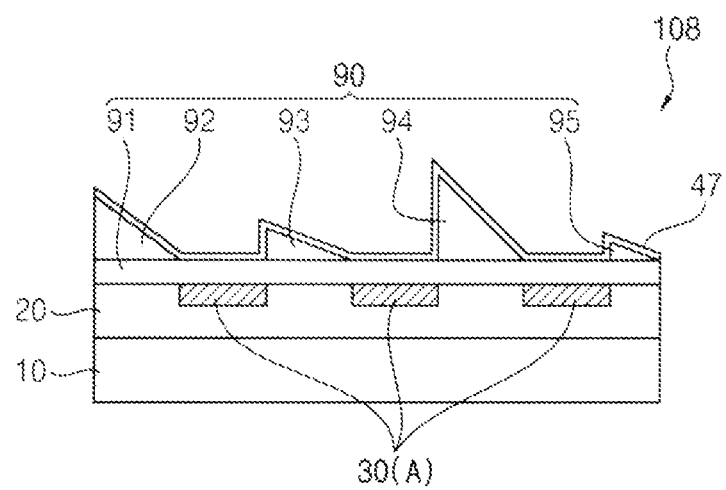
FIG. 16 is a cross-sectional view illustrating a structural coloration substrate according to still another example embodiment of the present invention.

FIG. 16 is a cross-sectional view illustrating a structural coloration substrate according to still another example embodiment of the present invention.

The structural coloration substrate 108 according to the present example embodiment is substantially same as the structural coloration substrate 104 according to the previous example embodiment of FIG. 9 and FIG. 10, except for at least on structural coloration layer 47 being stacked on an upper surface of a light conversion structure 90, and thus any repetitive explanation concerning the same technical features is omitted.

Referring to FIG. 16, the structural coloration substrate 108 according to the present example embodiment includes a base substrate 10, a first pattern 30 (or an upper substrate 20 in which the first pattern 30 is formed), a light conversion structure 90 and at least one structural coloration layer 47.

The base substrate 10 and the first pattern 30 or the upper substrate 20 formed on the base substrate 10 are substantially same as those in the structural coloration substrate 104 in FIG. 9 and FIG. 10.

However, in the present example embodiment, the light conversion structure 90 is formed on the first pattern 30 or the upper substrate 20 on which the first pattern 30 is formed.

The light conversion structure 90 includes a base frame 91 and at least one structure 92, 93, 94 and 95 formed on the base frame 91.

Here, the light conversion structure 90 is formed on the first pattern 30 or the upper substrate 20 on which the first pattern 30 is formed. The light conversion structure 90 is substantially same as the light conversion structure 70 in FIG. 9, except for each of the structures 92, 93, 94 and 95 extending perpendicular to the drawing of FIG. 16.

Cross-sectional shapes of first to fourth structures 92, 93, 94 and 95 of the light conversion structure 90 are different from each other. For example, all of the first to fourth structures 92, 93, 94 and 95 may have the cross-sectional shape of the right triangle, but a base and a height of each of the first to fourth structures 92, 93, 94 and 95 may be different from each other. Thus, the refractive index is different from each other in the first to fourth structures 92, 93, 94 and 95.

In the present example embodiment, the structural coloration layer 47 having at least one layer is stacked on the upper surface of the light conversion structure 90. Here, the number of the stacked layers and the thickness of the stacked layers are same all over the light conversion structure 90, which means that the structural coloration layer 47 is uniformly formed on the upper surface of the base frame 91 and the structures 92, 93, 94 and 95 regardless of the shapes of the base frame 91 and the structures 92, 93, 94 and 95.

Thus, the light merely passing through the base frame 91 in the light conversion structure 90 is not refracted and merely transmits, and thus the color displayed under the base frame 91 is maintained and displayed externally.

In the present example embodiment, since the structural coloration layer 47 is also formed on the upper surface of the base frame 91, the first color A displayed by the first pattern 30 under the base frame 91 is changed by the structural coloration layer 47 to be displayed as the first' color A' externally.

Although not shown in the figure, the light passing through the structures 92, 93, 94 and 95 of the light conversion structure 90 is refracted differently according to the shapes of the structures 92, 93, 94 and 95, and thus the color, for example the second color B, of the structural coloration layer 47 may be changed and displayed externally according to the patterns or shapes of the structures 92, 93, 94 and 95 even though the structural coloration layer 47 is formed on the upper surface of the structures 92, 93, 94 and 95.

Accordingly, the structural coloration substrate 108 according to the present example embodiment has the complex patterns and colors displayed externally and thus the imitation for the patterns and the colors may be impossible and the security may be enhanced. Thus, the information on the patterns and the colors may be encrypted, and the structural coloration substrate may be verified based on the encrypted information on the patterns and the colors.

Figure 17:
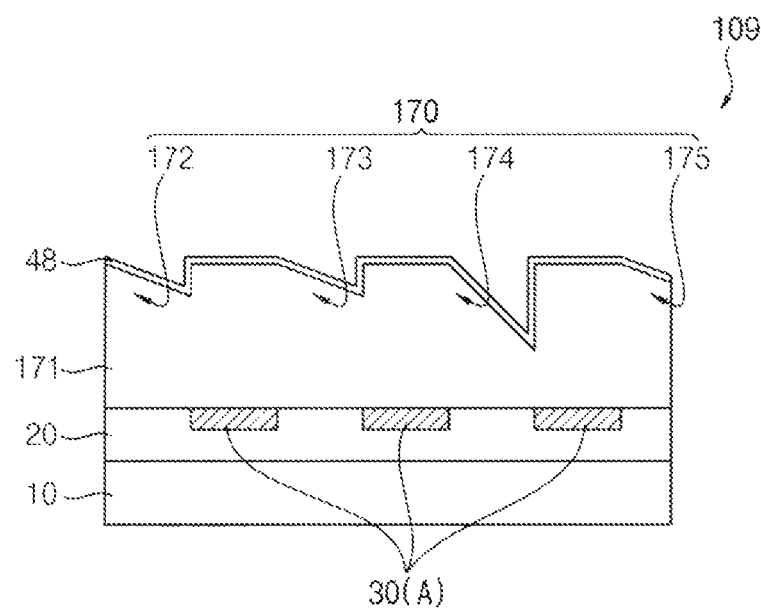
FIG. 17 is a cross-sectional view illustrating a structural coloration substrate according to still another example embodiment of the present invention.

FIG. 17 is a cross-sectional view illustrating a structural coloration substrate according to still another example embodiment of the present invention.

The structural coloration substrate 109 according to the present example embodiment is substantially same as the structural coloration substrate 108 according to the previous example embodiment of FIG. 16, except for at least one structure of a light conversion structure 170 being concaved or intruded into the base frame 171 and thus any repetitive explanation concerning the same technical features is omitted.

Referring to FIG. 17, the structural coloration substrate 109 according to the present example embodiment includes a base substrate 10, a first pattern 30 (or an upper substrate 20 in which the first pattern 30 is formed), a light conversion structure 170 and at least one structural coloration layer 48.

The first pattern 30 may be formed on the base substrate 10 using the quantum dot, and alternatively, the upper substrate 20 including the first pattern 30 may be formed on the base substrate 10.

The light conversion structure 170 is formed on the first pattern 30 or the upper substrate 20 on which the first pattern 30 is formed, and the structural coloration layer 48 having at least one layer is stacked uniformly on all over the light conversion structure 170.

Here, the light conversion structure 170 includes a base frame 171, and at least one structure 172, 173, 174 and 175 formed on the base frame 171. Here, at least one structure 172, 173, 174 and 175 is concaved or intruded into the base frame 171.

For example, each of first to fourth structures 172, 173, 174 and 175 may extend perpendicular to the drawing of FIG. 17, and cross-sectional shapes of the first to fourth structures 172, 173, 174 and 175 may be different from each other. As illustrated in FIG. 17, each of the first to fourth structures 172, 173, 174 and 175 has the cross-sectional shape of a right triangle, but a base and a height of each of the first to fourth structures 172, 173, 174 and 175 may be different from each other. Thus, the first to fourth structures 172, 173, 174 and 175 may have the refractive index different from each other.

As explained above, in the light conversion structure 170, the light merely passing through the base frame 171 is not refracted and merely transmits, and thus the color displayed under the base frame 171 is not changed and displayed externally.

However, in the present example embodiment, since the structural coloration layer 48 is also formed on the upper surface of the base frame 171, and thus the first color A displayed by the first pattern 30 under the base frame 171 is changed by the structural coloration layer 48. Then, the first' color A' is displayed outwardly or externally.

Although not shown in the figure, the light passing through the structures 172, 173, 174 and 175 of the light conversion structure 170 is refracted differently according to the concaved or intruded shapes of the structures 172, 173, 174 and 175, and thus the color, for example the second color B, of the structural coloration layer 48 may be changed and displayed externally according to the patterns or shapes of the structures 172, 173, 174 and 175 even though the structural coloration layer 48 is formed on the upper surface of the structures 172, 173, 174 and 175.

Accordingly, the structural coloration substrate 109 according to the present example embodiment has the complex patterns and colors displayed externally and thus the imitation for the patterns and the colors may be impossible and the security may be enhanced. Thus, the information on the patterns and the colors may be encrypted, and the structural coloration substrate may be verified based on the encrypted information on the patterns and the colors.

Hereinafter, the method for manufacturing each of the structural coloration substrates 104, 105, 106, 107, 108 and 109 explained above, is explained.

Figure 18:
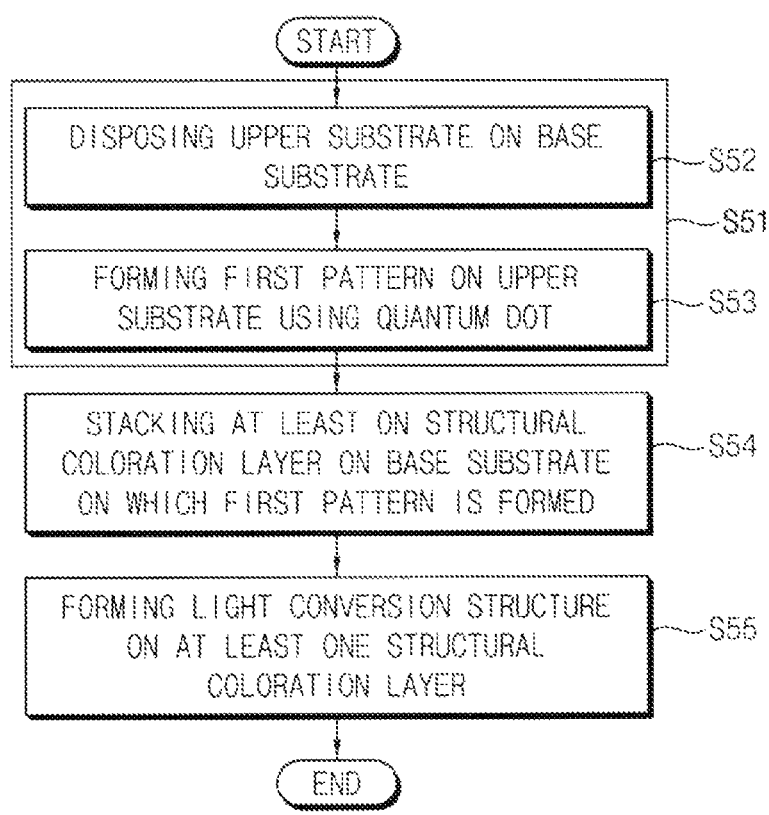
FIG. 18 is a flow chart illustrating a method for manufacturing the structural coloration substrates of FIG. 9 and FIG. 11.

FIG. 18 is a flow chart illustrating a method for manufacturing the structural coloration substrates of FIG. 9 and FIG. 11.

Referring to FIG. 18, in the method for manufacturing the structural coloration substrates 104 and 105 of FIG. 9 and FIG. 11, the first pattern 30 is formed on the upper surface of the base substrate 10 using the quantum dot (step S51).

Here, when the first pattern 30 is formed with the upper substrate 20, in forming the first pattern 30 (step S51) may include disposing the upper substrate 20 on the upper surface of the base substrate 10 (step S52) and forming the first pattern 30 on the upper substrate 20 using the quantum dot (step S53).

Alternatively, the first pattern 30 may be formed on the upper substrate 20 using the quantum dot, and then the upper substrate 20 having the first pattern 30 may be formed or disposed on the upper surface of the base substrate 10.

The step of forming the first pattern 30 on the upper substrate 20 may be the same as mentioned above, and the upper substrate 20 having the first pattern 30 may be disposed or formed on the upper surface of the base substrate 10 via the imprinting, the attaching and so on.

Then, at least one structural coloration layer 40 is stacked on the base substrate 10 on which the first pattern 30 is formed (step S54). Here, the method for stacking the structural coloration layer 40 and the material of the structural coloration layer 40 are substantially same as mentioned above.

Then, the light conversion structure 70 is formed on the structural coloration layer 40 (step S55). In forming the light conversion structure 70, as explained referring to FIG. 9, the structures 72, 73 and 74 may be formed to be protruded from the base frame 71 and then the light conversion structure 70 may be disposed or formed on the structural coloration layer 40. Here, the structures 72, 73 and 74 may be intruded or concaved into the base frame, as explained referring to FIG. 11.

Then, the structural coloration substrate 104 and 105 of FIG. 9 and FIG. 11 may be manufactured.

Figure 19:
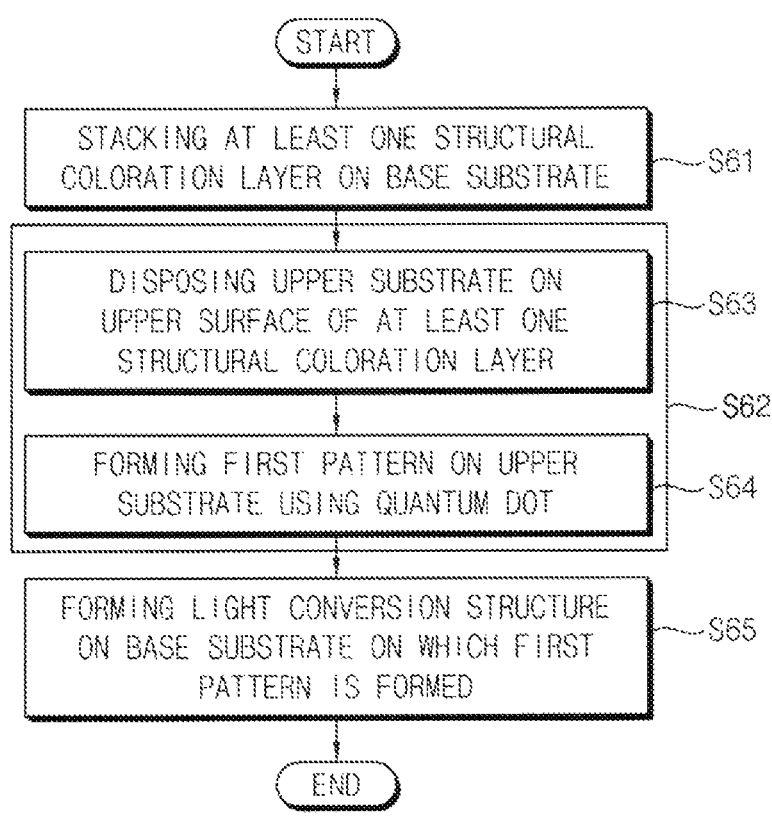
FIG. 19 is a flow chart illustrating a method for manufacturing the structural coloration substrate of FIG. 13.

FIG. 19 is a flow chart illustrating a method for manufacturing the structural coloration substrate of FIG. 13.

Referring to FIG. 19, in manufacturing the structural coloration substrate 106 in FIG. 13, at least one structural coloration layer 40 is stacked on the upper surface of the base substrate 10 (step S61). Here, the method for stacking the structural coloration layer 40 and the material of the structural coloration layer 40 are same as explained above.

Then, the first pattern 30 is formed on the upper surface of the structural coloration layer 40 using the quantum dot (step S62).

Likewise, when the upper substrate 20 is used for forming the first pattern 30, in forming the first pattern (step S62) includes disposing the upper substrate 20 on the upper surface of the structural coloration layer 40 (step S63) and forming the first pattern 30 on the upper substrate 20 using the quantum dot (step S64).

Alternatively, after forming the first pattern 30 on the upper substrate 20 using the quantum dot, the upper substrate 20 having the first pattern 30 may be formed or disposed on the upper surface of the base substrate 10.

The method for forming the first pattern 30 on the upper substrate 20 is same as explained above, and for example, the upper substrate 20 may be disposed or formed on the upper surface of the structural coloration layer 40 via the imprinting, the attaching and so on.

Then, the light conversion structure 70 is formed on the base substrate 10 on which the first pattern 30 is formed (step S65). In forming the light conversion structure 70, as explained referring to FIG. 13, the structures 72, 73 and 74 may be formed to be protruded from the base frame 71 and then the light conversion structure 70 may be disposed or formed on the structural coloration layer 40. Here, the structures 72, 73 and 74 may be intruded or concaved into the base frame, although not shown in the figure.

Then, the structural coloration substrate 106 of FIG. 13 may be manufactured.

Figure 20:
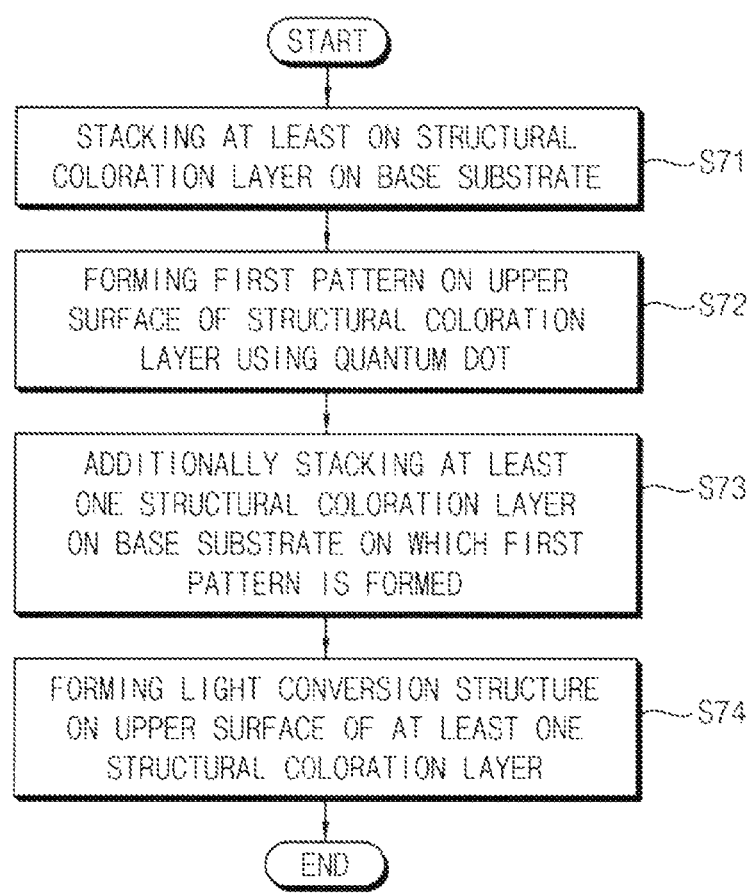
FIG. 20 is a flow chart illustrating a method for manufacturing the structural coloration substrate of FIG. 15.

FIG. 20 is a flow chart illustrating a method for manufacturing the structural coloration substrate of FIG. 15.

Referring to FIG. 20, in manufacturing the structural coloration substrate 107 of FIG. 15, at least on structural coloration layer 40_1 is stacked on the upper surface of the base substrate 10 (step S71). Here, the method for stacking the structural coloration layer 40_1 and the material of the structural coloration layer 40_1 are same as explained above.

Then, the first pattern 30 is formed on the upper surface of the structural coloration layer 40_1 using the quantum dot (step S72).

Likewise, in using the upper substrate 20 in forming the first pattern 30, forming the first pattern 30 includes disposing the upper substrate 20 on the upper surface of the structural coloration layer 40_1 and forming the first pattern 30 on the upper substrate 20 using the quantum dot.

Then, at least one additional structural coloration layer 40_2 is additionally stacked on the base substrate 10 on which the first pattern 30 is formed (step S73). Here, when the first pattern 30 is formed on the upper substrate 20, the additional structural coloration layer 40_2 may be additionally stacked on the upper substrate 20.

Here, the additionally stacked structural coloration layer 40_2 may be stacked with the same method of stacking the structural coloration layer 40_1, but the material or the number of the additionally stacked structural coloration layer 40_2 may be different from that of the stacked structural coloration layer 40_1.

Then, the light conversion structure is formed on the upper surface of the additional structural coloration layer 40_2 (step S74), and the structure of the light conversion structure may be same as explained referring to FIG. 13.

Then, the structural coloration substrate 107 of FIG. 15 may be manufactured.

Figure 21:
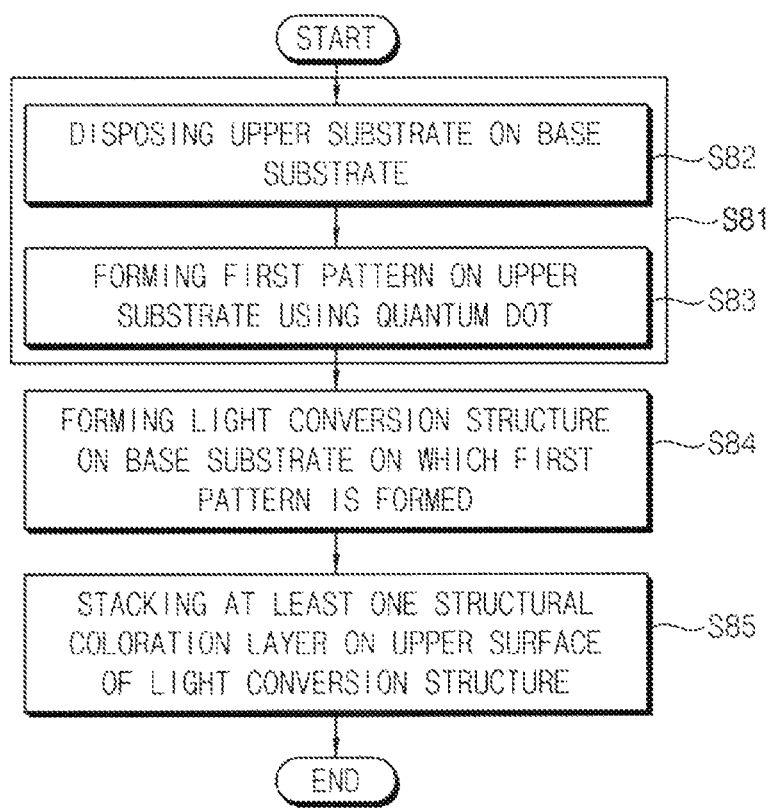
FIG. 21 is a flow chart illustrating a method for manufacturing the structural coloration substrates of FIG. 16 and FIG. 17.

FIG. 21 is a flow chart illustrating a method for manufacturing the structural coloration substrates of FIG. 16 and FIG. 17.

Referring to FIG. 21, in the method for manufacturing the structural coloration substrate 108 and 109 of FIG. 16 and FIG. 17, the first pattern 30 is formed on the upper surface of the base substrate 10 using the quantum dot (step S81).

Here, when the upper substrate 20 is used for forming the first pattern 30, forming the first pattern 3 (step S81) includes disposing the upper substrate 20 on the upper surface of the base substrate 10 (step S82) and forming the first pattern 30 on the upper substrate 20 using the quantum dot (step S83).

Here, after forming the first pattern 30 on the upper substrate 20 using the quantum dot, the upper substrate 20 having the first pattern 30 may be disposed or formed on the upper surface of the base substrate 10.

The method for forming the first pattern 30 on the upper substrate 20 is same as explained above, and the upper substrate 20 having the first pattern 30 may be formed or disposed on the base substrate 10 via the imprinting, the attaching and so on.

Then, the light conversion structure 90 and 170 is formed on the base substrate 10 on which the first pattern 30 is formed (step S84).

Here, in forming the light conversion structure 90, as explained referring to FIG. 16, the structures 92, 93, 94 and 95 are formed to be protruded from the base frame 91, and then the light conversion structure 90 is formed or disposed on the upper substrate 20.

Alternatively, in forming the light conversion structure 170, as explained referring to FIG. 17, the structures 172, 173, 174 and 175 are formed to be intruded or concaved into the base frame 171, and then the light conversion structure 170 is formed or disposed on the upper substrate 20.

Then, at least one structural coloration layer 47 and 48 is stacked on the upper surface of the light conversion structure 90 and 170. Here, the method for stacking the structural coloration layer 47 and 48, and the material of the structural coloration layer 47 and 48 are same as explained above.

Then, the structural coloration substrates 108 and 109 of FIG. 16 and FIG. 17 are manufactured.

The structural coloration substrate is manufactured via each of the methods mentioned above example embodiments, and the structural coloration substrate may be manufactured as a security substrate 100, 101, 102, 103, 104, 105, 106, 107, 108 and 109 when the structural coloration substrate is used for the security. The structural coloration substrate, which is the security substrate 100, 101, 102, 103, 104, 105, 106, 107, 108 and 109 (hereinafter, the security substrate) includes various colors and various arrangements, and thus the information on the colors and the arrangements is encrypted to be used for maintain the security. As mentioned above, the colors and the arrangements included in the security substrate 100, 101, 102, 103, 104, 105, 106, 107, 108 and 109 may be variously changed according to each process for manufacturing the security substrate, and the same color and the same arrangement are only performed by the same process. Thus, if the specific manufacturing process, and the color and the arrangement performed by the specific manufacturing process are secured and protected, the security substrate 100, 101, 102, 103, 104, 105, 106, 107, 108 and 109 having the same color and the same arrangement is impossible to be manufactured by a third party.

Accordingly, the security substrate 100, 101, 102, 103, 104, 105, 106, 107, 108 and 109 manufactured by the method for manufacturing the structural coloration substrate as explained above may be used as a security verification system mentioned below, and then, the security verification system using the security substrate will be explained below.

Figure 22:
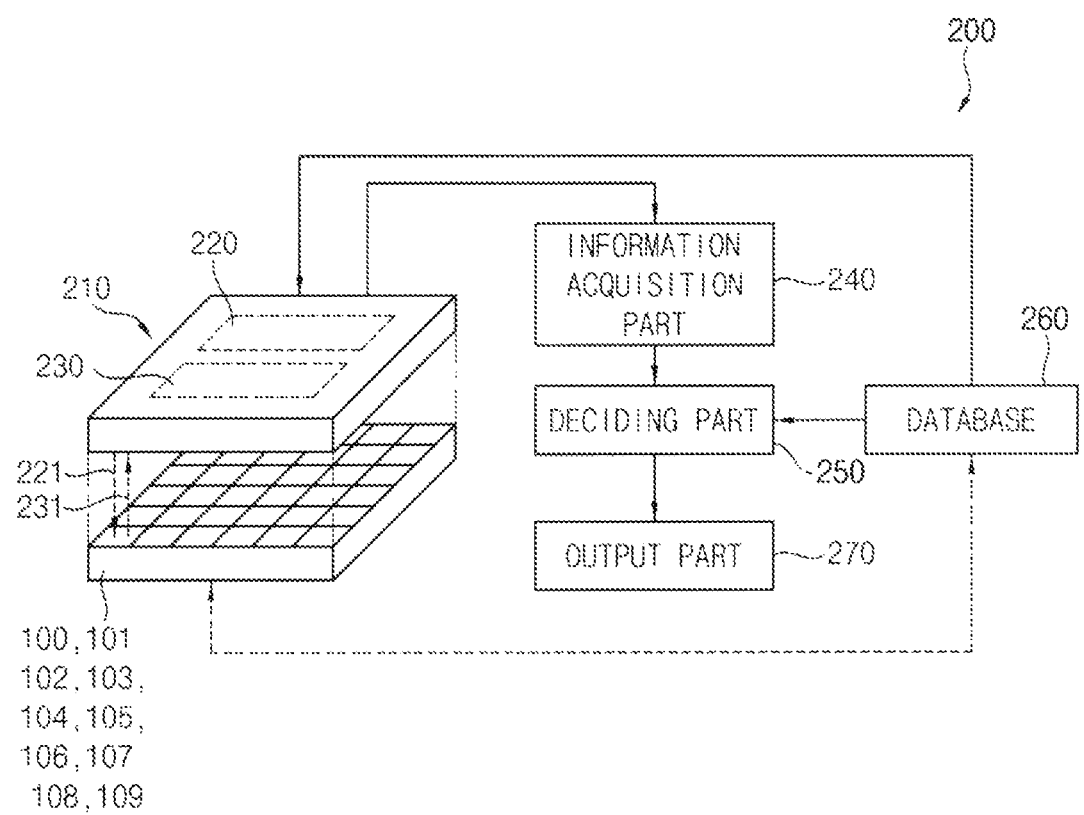
FIG. 22 is a schematic view illustrating a security verification system using the structural coloration substrate manufactured by the method mentioned above according to the example embodiments of the present invention.
Figure 23:
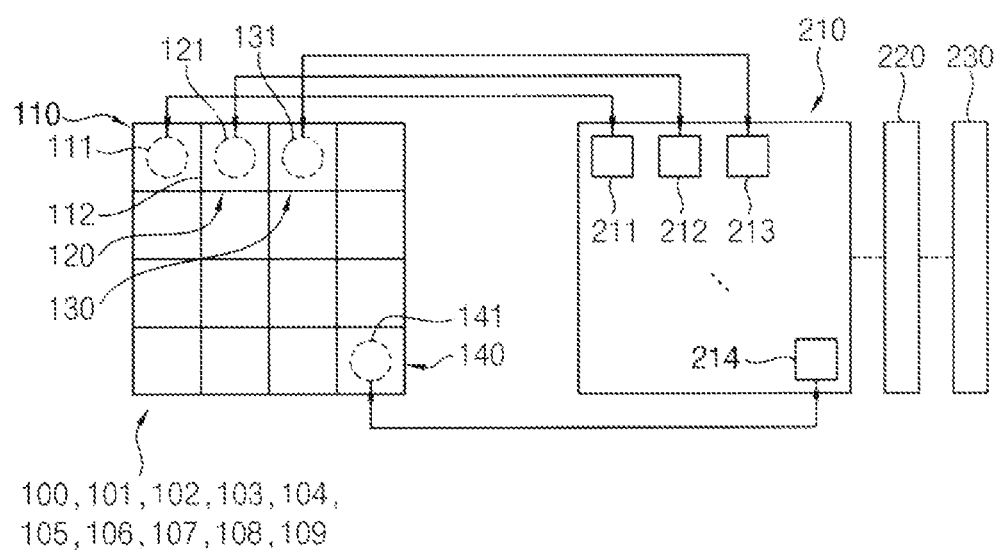
FIG. 23 is a schematic view illustrating the structural coloration substrate receiving the light in the security verification system of FIG. 22.

FIG. 22 is a schematic view illustrating a security verification system using the structural coloration substrate manufactured by the method mentioned above according to the example embodiments of the present invention. FIG. 23 is a schematic view illustrating the structural coloration substrate receiving the light in the security verification system of FIG. 22

Referring to FIG. 22, the security verification system 200 is the system for confirming and verifying the security substrate 100, 101, 102, 103, 104, 105, 106, 107, 108 and 109, and as mentioned above, the security substrate 100, 101, 102, 103, 104, 105, 106, 107, 108 and 109 is manufactured by the method according to the previous example embodiments.

The security verification system 200 includes the security substrate 100, 101, 102, 103, 104, 105, 106, 107, 108 and 109, and further includes a scanner 210, an information acquisition part 240, a deciding part 250, a database 260 and an output part 270.

The security substrate 100, 101, 102, 103, 104, 105, 106, 107, 108 and 109 includes a specific structural coloration pattern formed inside thereof and thus displays a specific color and pattern outwardly, and the specific color and pattern of the security substrate 100, 101, 102, 103, 104, 105, 106, 107, 108 and 109 are encrypted and provided to the database 260.

Here, the color and the pattern of the security substrate 100, 101, 102, 103, 104, 105, 106, 107, 108 and 109 are changed according to the specific processes in manufacturing the security substrate 100, 101, 102, 103, 104, 105, 106, 107, 108 and 109, and thus the information on the specific processes in manufacturing the security substrate 100, 101, 102, 103, 104, 105, 106, 107, 108 and 109 is also encrypted and provided to the database 260.

In addition, the color displayed by the security substrate 100, 101, 102, 103, 104, 105, 106, 107, 108 and 109 is also changed according to the angle of the incident light and the viewing angle, and thus the information on the color according to the angle is also encrypted and provided to the database 260.

The scanner 210 is disposed over the security substrate 100, 101, 102, 103, 104, 105, 106, 107, 108 and 109, and scans the security substrate 100, 101, 102, 103, 104, 105, 106, 107, 108 and 109. Here, the scanner 210 includes a light emitting part 220 and a light receiving part 230. Then, an incident light 221 from the light emitting part 220 is provided into the security substrate 100, 101, 102, 103, 104, 105, 106, 107, 108 and 109, and the light receiving part 230 receives a reflective light 231 reflected by the security substrate 100, 101, 102, 103, 104, 105, 106, 107, 108 and 109.

Then, the scanner 210 provides the information on the incident light 221 and the reflective light 231 to the information acquisition part 240.

Here, the information acquisition part 240 may be implemented as an application (APP) for a mobile device such as a mobile phone, a tablet PC and so on, and thus the user may receive the information directly using the APP.

As explained above, the security substrate 100, 101, 102, 103, 104, 105, 106, 107, 108 and 109 is manufactured to display various patterns and various colors, and thus scanner 210 may scan the security substrate 100, 101, 102, 103, 104, 105, 106, 107, 108 and 109 by each pattern. That is, the scanner 210 obtains the information on the incident light 221 and the reflective light 231, by each pattern.

For example, referring to FIG. 23, if the security substrate 100, 101, 102, 103, 104, 105, 106, 107, 108 and 109 is manufactured to have the checkerboard pattern, the areas obtained by the scanner in the security substrate 100, 101, 102, 103, 104, 105, 106, 107, 108 and 109 may be divided into first to n areas 110, 120, 130, . . . , 140.

Thus, when the information on the pattern of the security substrate 100, 101, 102, 103, 104, 105, 106, 107, 108 and 109 is already provided to the database 260, the scanner 210 scans the divided areas of the security substrate 100, 101, 102, 103, 104, 105, 106, 107, 108 and 109 based on the pre-received information on the pattern of the security substrate 100, 101, 102, 103, 104, 105, 106, 107, 108 and 109.

Here, to scan the first to n areas 110, 120, 130, . . . , 140 of the security substrate independently, the scanner 210 may include first to n sub-scanners 211, 212, 213, . . . , 214 respectively scanning the first to n areas 110, 120, 130, . . . , 140.

Accordingly, the first to n sub-scanner 211, 212, 213, . . . , 214 respectively scan the first to n areas 110, 120, 130, . . . , 140, and then the information on the incident light 221 and the reflective light 231 at each area is obtained. Then, the obtained information is provided to the information acquisition part 240.

Here, the number of the sub-scanners and the arrangement of the sub-scanners may be changed according to the number of the patterns and the arrangement of the patterns of the security substrate 100, 101, 102, 103, 104, 105, 106, 107, 108 and 109.

Referring to the method for manufacturing the structural coloration substrate mentioned above, the security substrate 100, 101, 102, 103, 104, 105, 106, 107, 108 and 109 may be stacked or formed with various kinds of materials with various processes such as the coating, the inkjet printing, the imprinting and so on. Thus, the boundary area between the patterns of the security substrate 100, 101, 102, 103, 104, 105, 106, 107, 108 and 109 may be blurred or be hard to be identified as the processes are additionally performed.

Even though the first area 110 and the second area 120 display the colors different from each other, the colors may not be clearly distinguished with each other with respect to a first boundary line 112. The color displayed in the first area 110 and the color displayed in the second area 120 may be blurred, mixed or displayed with a gradation in the areas adjacent to the first boundary line 112.

Thus, in the present example embodiment, when the first to n sub-scanners 211, 212, 213, . . . , 214 respectively scan the first to n areas 110, 120, 130, . . . , 140), each of the first and n sub-scanners 211, 212, 213, . . . , 214 scans a central portion of each of the first to n areas 110, 120, 130, . . . , 140, instead of scanning a boundary area thereof.

Thus, even though the colors are blurred, mixed or displayed with the gradation in the areas adjacent to the boundary line between the areas adjacent to each other, the scanned information may be more clearly and correctly obtained.

Accordingly, the scanner 210 provides the incident light 221 into each of the divided areas of the security substrate 100, 101, 102, 103, 104, 105, 106, 107, 108 and 109 using the light emitting part 220, and receives the reflective light 231 reflected on each of the divided areas using the light receiving part 230. Then, the received information is provided into the information acquisition part 240.

The information acquisition part 240 receives the information of the light emitting into the security substrate 100, 101, 102, 103, 104, 105, 106, 107, 108 and 109 and the information of the light receiving from the security substrate 100, 101, 102, 103, 104, 105, 106, 107, 108 and 109, which are obtained by the scanner 210, and then acquires the security pattern on the security substrate 100, 101, 102, 103, 104, 105, 106, 107, 108 and 109.

The information acquisition part 240 acquires the information on the pattern of the security substrate 100, 101, 102, 103, 104, 105, 106, 107, 108 and 109 and the information on the color displayed at each of the areas divided by the pattern of the security substrate 100, 101, 102, 103, 104, 105, 106, 107, 108 and 109. Thus, the information acquisition part 240 derives the characteristics of the security pattern of the security substrate 100, 101, 102, 103, 104, 105, 106, 107, 108 and 109 and the information of the color at each pattern.

The deciding part 250 compares the information on the security pattern obtained by the information acquisition part 240 to the information on the encrypted color and pattern of the security substrate 100, 101, 102, 103, 104, 105, 106, 107, 108 and 109 provided by the database 260, and then decides whether the scanned security substrate is coincided with the real or actual security substrate or not.

Here, in the deciding part 250, the information on the shape of the arrangement of the pattern and the information on the color at each of the areas divided by the pattern are compared, and the decision criteria may be pre-determined. For example, the decision criteria may be more than 80% coincidence or same in the shape of the arrangement of the pattern and more than 80% coincidence or same in the color at each divided area.

Accordingly, the decision result by the deciding part 250 is outputted by the output part 270, and then the authenticity of the scanned security substrate may be confirmed or identified by the user.

Figure 24:
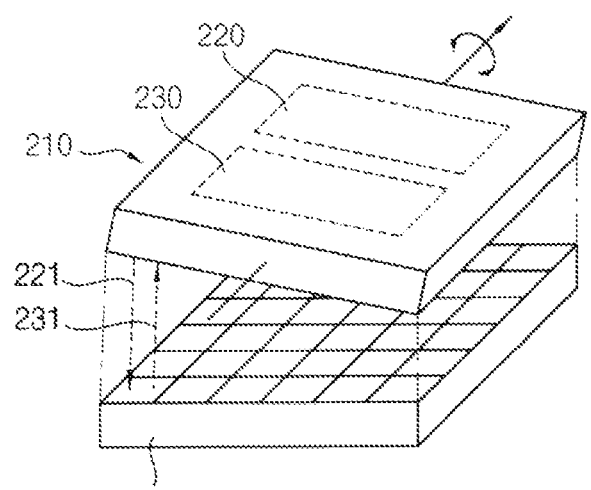
FIG. 24 is a schematic view illustrating a scanner rotated to scan the structural coloration substrate (security substrate) in the security verification system of FIG. 22.

FIG. 24 is a schematic view illustrating a scanner rotated to scan the structural coloration substrate (security substrate) in the security verification system of FIG. 22.

As explained above in the method for manufacturing the structural coloration substrate, the color displayed by the security substrate is changed according to the angle of the incident light and the viewing angle by the user. Here, the viewing angle may mean the angle of the incident light.

In addition, the information on the change of the color according to the angle of the incident light, is not changed after the security substrate is completely manufactured, and thus the information is pre-stored at the database 260.

To perform the verification of the security substrate more correctly and more increased reliability, the scanning on the security substrate 100, 101, 102, 103, 104, 105, 106, 107, 108 and 109 may be performed according to the angle of the incident light, and then the comparison of the information on the pattern and the color of the security substrate 100, 101, 102, 103, 104, 105, 106, 107, 108 and 109 may be performed according to the angle of the incident light.

As illustrated in FIG. 24, the scanner 210 in the present example embodiment rotates with respect to a central axis and thus the scanner 210 rotates with respect to the security substrate 100, 101, 102, 103, 104, 105, 106, 107, 108 and 109.

As the scanner 210 rotates, the angle of the incident light 221 incident into the security substrate 100, 101, 102, 103, 104, 105, 106, 107, 108 and 109 is changed, and thus the information of the color on the security substrate 100, 101, 102, 103, 104, 105, 106, 107, 108 and 109 obtained by the reflective light 231 may be also changed.

Thus, if the information of the color on the security substrate 100, 101, 102, 103, 104, 105, 106, 107, 108 and 109 changed according to the angle of the incident light is pre-stored in the database 260, the information of the color on the scanned security substrate changed according to the angle of the incident light may be compared with the pre-stored information and then the authenticity of the scanned security substrate may be confirmed or identified more correctly and more reliably.

Alternatively, although not shown in the figure, instead of rotating the scanner 210, the security substrate 100, 101, 102, 103, 104, 105, 106, 107, 108 and 109 may be rotated with respect to the scanner 210, to change the angle of the incident light. In this case, the authenticity of the scanned security substrate may be confirmed or identified via the above-mentioned process or method.

Here, the rotation of the scanner 210 or the rotation of the authenticity of the scanned security substrate may be confirmed or identified may be temporarily performed only when the incident light is provided, that is only when the information on the security substrate 100, 101, 102, 103, 104, 105, 106, 107, 108 and 109 is obtained. Thus, the authenticity of the scanned security substrate may be confirmed or identified with enhanced security and reliability.

Accordingly, the additional criteria to decide whether the security substrate is authentic or not is considered or selected, so that the verification on the security substrate may be performed more strictly to increase the security and the reliability.

According to the present example embodiments, in addition to merely stacking the structural coloration layers, the structural coloration substrate may be formed using the quantum dot. Here, the structural coloration substrate has a various and complex pattern according to the pattern of the quantum dot, and thus the light having various kinds of colors may exit according to the direction of the incident light in the structural coloration substrate.

In addition, the structural coloration substrate may be formed using the quantum dot and the light conversion structure having at least one structure. Here, a various and complex pattern may be formed according to the pattern of the quantum dot and the shape or the arrangement of the structures of the light conversion structure, and thus the light having various kinds of colors may exit according to the direction of the incident light in the structural coloration substrate.

The above mentioned structural coloration substrate exiting various kinds of colors and patterns may be used as the security substrate. Thus, the encrypted security substrate may be manufactured, and the security substrate may be used to an encrypted code for moneys or expensive products for enhancing the security.

Here, the light conversion structure may be formed to be protruded from or be inwardly concaved from the base frame, and may include patterns extending along a direction or being arranged with various shapes. Thus, the security pattern may be diversified. In addition, as for the light conversion structure, a vertical cross-sectional shape may be a triangle, and combination of inner angles thereof may be diversified. Thus, the color externally displayed may be diversified to enhance encryption of the security pattern more effectively.

In addition, the quantum dot used pattern may be embedded in the substrate or be protruded from the substrate, and may be formed as the encrypted code such as the dot pattern, the longitudinal pattern and the checkerboard pattern. Here, the forming or the manufacturing the pattern may be performed more easily or more efficiently. The structural coloration layer may be stacked via an atomic layer deposition, and thus the coating may be performed to have a relatively fine thickness in a range about tens of nano meters and the effect of the structural coloration may be maintained. Thus, the structural coloration substrate may be effectively used for the moneys or the barcodes.

In addition, the protective layer is coated on an uppermost surface, and thus the encrypted security pattern may be prevented from being easily damaged. Thus, the security and the durability of the security pattern may be increased.

The structural coloration substrate having the quantum dot, the structural coloration layer and the light conversion structure may be easily manufactured, and thus various kinds of patterns may be included and the productivity and the manufacturing efficiency may be increased.

In addition, the security substrate manufactured by the method mentioned above, may be effectively used for the security verification system. Here, in the security verification system, the security pattern may be identified by the scanner, and the coincidence between the security pattern and the stored pattern may be decided.

Here, the structural coloration substrate may display various kinds of complex colors and patterns due to the addition of the quantum dot or the light conversion structure. Thus, if the structural coloration substrate is encrypted and used for the security verification system, the structural coloration substrate may be prevented from being imitated, and thus the security may be more increased. Here, the pattern or the color displayed by the structural coloration substrate may be imitated only if the entire processes for manufacturing the structural coloration substrate are substantially same, and it is impossible to find out the entire manufacturing processes from the final product of the structural coloration substrate. Thus, the imitation or the copy of the pattern or the color of the structural coloration substrate may be impossible in principle, and thus the security may be more increased.

However, due to the limitation of the manufacturing processes of the structural coloration substrate, the color or the pattern may be blurred or be hard to be identified in a boundary area between the adjacent patterns. Thus, in scanning the structural coloration substrate, the scanner would better scan the color or the pattern at a central portion of each pattern in the structural coloration substrate.

In addition, the database includes an information displayed by the security pattern according to the angle of the incident light, and the scanner may rotate to change the angle of the incident light incident into the security substrate. Thus, the verification for the single security substrate may be performed with various kinds of processes, and thus the security may be more increased.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing a substrate, the method comprising:
    forming a base substrate having a black-based color;
    disposing an upper substrate directly on the base substrate and forming a groove on the upper substrate;
    forming a pattern on the upper substrate by filling a quantum dot displaying a first color into the groove; and
    stacking at least one structural coloration layer on an upper surface of the pattern,
    wherein
        the first color of the pattern is changed according to a quantity of the at least one structural coloration layer being stacked, and
        the at least one structural coloration layer is formed to induce a constructive interference of light.

2. The method of claim 1, wherein the base substrate absorbs a light and externally displays a second color different from the first color,
    wherein the at least one structural coloration layer being stacked causes the second color of the base substrate to be changed and displayed.

3. A method for manufacturing a substrate, the method comprising:
    stacking a first at least one structural coloration layer on a base substrate; and
    forming a pattern displaying a first color in a first area on an upper surface of the at least one structural coloration layer, using a quantum dot,
    wherein the first at least one structural coloration layer being stacked causes a second color of the base substrate in a second area to be changed and displayed, the second area being free from the quantum dot.

4. The method of claim 3, further comprising:
    stacking a second at least one structural coloration layer on the pattern,
    wherein the second at least one structural coloration layer being stacked causes the first color of the pattern to be changed and displayed.

5. A method for manufacturing a substrate, the method comprising:
    stacking at least one structural coloration layer on a base substrate;
    forming a groove in a first area by etching the at least one structural coloration layer and an upper part of the base substrate, to form a pattern; and
    filling a quantum dot displaying a first color into the groove,
    wherein the at least one structural coloration layer causes a second color of the base substrate in a second area to be changed and displayed, the second area being free from the quantum dot.

6. The method of claim 5, further comprising:
    coating a protective layer on upper surfaces of the at least one structural coloration layer and the pattern.

7. A method for manufacturing a substrate, the method comprising:
    forming a base substrate having a black-based color;
    disposing an upper substrate directly on the base substrate and forming a groove on the upper substrate;

forming a pattern on the upper substrate by filling a quantum dot displaying a first color into the groove;

stacking at least one structural coloration layer displaying a second color on an upper surface of the pattern; and forming a light conversion structure on the at least one structural coloration layer, wherein the first color displayed by the pattern is changed according to a quantity of the at least one structural coloration layer, and the at least one structural coloration layer is formed to induce a constructive interference of light.

8. The method of claim 7, wherein the at least one structural coloration layer being stacked causes the first color to be changed and displayed, and the second color is changed and displayed due to the light conversion structure.

9. A method for manufacturing a substrate, the method comprising:

stacking a first at least one structural coloration layer displaying a first color on a base substrate;

forming a pattern displaying a second color on an upper surface of the first at least one structural coloration layer, using a quantum dot; and forming a light conversion structure on an upper surface of the pattern which is formed on the upper surface of the first at least one structural coloration layer, the light conversion structure changing the first color and displaying the changed color.

10. The method of claim 9, comprising:

stacking a second at least one structural coloration layer displaying a color different from the first color on the base substrate, on which the pattern is formed, wherein the light conversion structure is formed on the upper surface of the second at least one structural coloration layer.

11. A method for manufacturing a substrate, the method comprising:

forming a first pattern displaying a first color on a base substrate, using a quantum dot;

forming a light conversion structure on an upper surface of the first pattern which is formed on the base substrate; and stacking at least one structural coloration layer displaying a second color on an upper surface of the light conversion structure, wherein the first color displayed by the first pattern is changed according to a quantity of the at least one structural coloration layer.

12. The method of claim 11, wherein the at least one structural coloration layer being stacked causes the first color to be changed and displayed, and the second color is changed and displayed due to the light conversion structure.

13. A multi-layer stacked substrate comprising:

a base substrate;

a first pattern having a quantum dot displaying a first color;

at least one structural coloration layer, wherein one of the first pattern and the at least one structural coloration layer is disposed on an upper surface of the base substrate; and a light conversion structure having at least one structure with different shapes from each other being arranged, wherein the light conversion structure is disposed on an upper surface of one of the first pattern and the at least one structural coloration layer, wherein the first color is changed according to a quantity of the at least one structural coloration layer.

14. The multi-layer stacked substrate of claim 13, wherein the light conversion structure further comprises a base frame disposed on at least one of an upper surface of the first pattern and an upper surface of the at least one structural coloration layer.

15. The multi-layer stacked substrate of claim 14, wherein the at least one structure has a shape upwardly protruded from the base frame or a shape inwardly concaved from the base frame, wherein the at least one structure extends over the base frame along a direction or is arranged in a predetermined pattern over the base frame, and a cross-sectional shape of each structure is a triangle.

16. The multi-layer stacked substrate of claim 13, wherein the at least one structural coloration layer displays a second color, and the second color is changed and displayed when the at least one structure overlaps with the at least one structural coloration layer, wherein the second color is changed and displayed with a different color, when the at least one structural coloration layer overlaps with the at least one structure having shapes different from each other.

17. The multi-layer stacked substrate of claim 13, wherein the first pattern is formed on an upper surface of the base substrate, the at least one structural coloration layer is formed on the first pattern, and the light conversion structure is disposed on an upper surface of the structural coloration layer.

18. The multi-layer stacked substrate of claim 13, wherein the at least one structural coloration layer is formed on an upper surface of the base substrate, the first pattern is disposed on an upper surface of the at least one structural coloration layer, and the light conversion structure is disposed on the first pattern.

19. The multi-layer stacked substrate of claim 13, wherein the first pattern is disposed on an upper surface of the base substrate, the light conversion structure is disposed on the first pattern, and the at least one structural coloration layer is formed on an upper surface of the light conversion structure.

* * * * *